US012225699B2

(12) United States Patent
Yoon et al.

(10) Patent No.: US 12,225,699 B2
(45) Date of Patent: Feb. 11, 2025

(54) ELECTRONIC DEVICE INCLUDING SHIELDING AND HEAT DISSIPATION STRUCTURE

(71) Applicant: Samsung Electronics Co., Ltd., Suwon-si (KR)

(72) Inventors: Hyunjoong Yoon, Suwon-si (KR); Heesoon Park, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 94 days.

(21) Appl. No.: 18/160,475

(22) Filed: Jan. 27, 2023

(65) Prior Publication Data
US 2023/0171932 A1 Jun. 1, 2023

Related U.S. Application Data

(63) Continuation of application No. PCT/KR2021/009578, filed on Jul. 23, 2021.

(30) Foreign Application Priority Data

Jul. 31, 2020 (KR) ........................ 10-2020-0096360

(51) Int. Cl.
*G06F 1/16* (2006.01)
*H01Q 1/24* (2006.01)
(Continued)

(52) U.S. Cl.
CPC ......... *H05K 9/0081* (2013.01); *G06F 1/1656* (2013.01); *G06F 1/1698* (2013.01);
(Continued)

(58) Field of Classification Search
CPC .............................. G06F 1/1656; G06F 1/1698
See application file for complete search history.

(56) References Cited

U.S. PATENT DOCUMENTS 6,014,315 A * 1/2000 McCullough ....... H01L 23/4006
174/16.3
6,377,475 B1 * 4/2002 Reis ..................... H05K 9/0035
174/394
(Continued)

FOREIGN PATENT DOCUMENTS

JP 201221000 A 10/2012
KR 1020160009914 A 1/2016
(Continued)

OTHER PUBLICATIONS

Korean Office Action Issued Nov. 26, 2024 of KR 10-2020-0096360.

*Primary Examiner* — Adrian S Wilson
(74) *Attorney, Agent, or Firm* — CANTOR COLBURN LLP

(57) ABSTRACT

An electronic device includes an electronic component on ae printed circuit board, an electrical shield extended around the electronic component and defining an opening corresponding to the electronic component, a heat diffusion pattern on the electronic component, and a shielding sheet which extends across the opening of the electrical shield and commonly overlaps the electronic component, the electrical shield and the heat diffusion pattern. The shielding sheet includes a first heat diffusion member which is inside the opening of the electrical shield and contacts the heat diffusion pattern, and a second heat diffusion member which is attached to the first heat diffusion member, extends across the opening of the electrical shield and contacts both an upper portion of the electrical shield and the first heat diffusion member.

20 Claims, 16 Drawing Sheets

(51) Int. Cl.
*H04M 1/02* (2006.01)
*H05K 7/20* (2006.01)
*H05K 9/00* (2006.01)

(52) U.S. Cl.
CPC .......... *H01Q 1/243* (2013.01); *H04M 1/0277* (2013.01); *H05K 7/20963* (2013.01)

(56) References Cited

U.S. PATENT DOCUMENTS

| | | | | |
|---|---|---|---|---|
| 6,744,640 B2* | 6/2004 | Reis | .................... | H05K 9/0028 |
| | | | | 257/E23.114 |
| 7,245,896 B2* | 7/2007 | Seo | .................... | H05K 9/0028 |
| | | | | 363/16 |
| 8,115,117 B2* | 2/2012 | Kapusta | ............... | H05K 9/0024 |
| | | | | 427/96.4 |
| 8,493,749 B2* | 7/2013 | Myers | .................. | H05K 9/0024 |
| | | | | 361/818 |
| 8,654,543 B2* | 2/2014 | Lee | .................... | H05K 3/4697 |
| | | | | 361/795 |
| 9,436,235 B2* | 9/2016 | Damaraju | ............ | H01L 23/427 |
| 9,793,223 B2* | 10/2017 | Yoo | ....................... | H01L 23/315 |
| 9,877,380 B2* | 1/2018 | Wanner | ............... | H05K 7/20454 |
| 9,924,616 B2 | 3/2018 | Song et al. | | |
| 10,104,763 B2* | 10/2018 | Lee | ....................... | H05K 1/0203 |
| 10,542,630 B2* | 1/2020 | Pahl | ...................... | H05K 9/0028 |
| 10,617,033 B2 | 4/2020 | Min et al. | | |
| 10,652,996 B2* | 5/2020 | Chiu | ....................... | H05K 9/003 |
| 10,667,442 B2* | 5/2020 | Nakata | .................... | G06F 1/184 |
| 10,699,985 B2 | 6/2020 | Chung et al. | | |
| 10,756,000 B2 | 8/2020 | Jin et al. | | |
| 10,757,846 B2 | 8/2020 | Lee et al. | | |
| 11,043,461 B2* | 6/2021 | Kumura | ................. | H01L 23/433 |
| 11,047,628 B2 | 6/2021 | Lee et al. | | |
| 11,178,799 B2 | 11/2021 | Lee et al. | | |
| 11,357,142 B2* | 6/2022 | Yoon | .................... | H05K 7/20336 |
| 11,379,022 B2* | 7/2022 | Park | .................... | H05K 7/20336 |
| 2003/0193794 A1* | 10/2003 | Reis | .................... | H05K 7/20445 |
| | | | | 257/E23.114 |
| 2004/0247925 A1* | 12/2004 | Cromwell | ............ | H05K 7/1061 |
| | | | | 257/E23.101 |
| 2004/0259326 A1* | 12/2004 | Hideo | ................ | G02F 1/136277 |
| | | | | 438/458 |
| 2013/0082367 A1* | 4/2013 | Yoo | ..................... | H01L 25/0655 |
| | | | | 438/584 |
| 2014/0240179 A1 | 8/2014 | Kim et al. | | |
| 2017/0135240 A1* | 5/2017 | Pahl | ..................... | H05K 5/069 |
| 2017/0181266 A1* | 6/2017 | Hunt | .................... | H05K 7/20445 |
| 2018/0131087 A1* | 5/2018 | Kim | ..................... | H05K 9/0026 |
| 2018/0146539 A1* | 5/2018 | Zhang | ..................... | H05K 5/02 |
| 2018/0288908 A1* | 10/2018 | Lee | ...................... | H05K 9/003 |
| 2019/0043779 A1* | 2/2019 | Chung | ................... | H05K 1/0203 |
| 2019/0067157 A1* | 2/2019 | Lin | ....................... | H01L 23/433 |
| 2019/0364695 A1* | 11/2019 | Lee | ..................... | H05K 7/20336 |
| 2020/0053919 A1 | 2/2020 | Lee et al. | | |
| 2020/0137931 A1* | 4/2020 | Lee | ..................... | H05K 9/0031 |
| 2020/0152581 A1* | 5/2020 | Kumura | ............... | H01L 23/3737 |
| 2020/0209973 A1* | 7/2020 | Kim | ...................... | G06F 3/016 |
| 2021/0029855 A1* | 1/2021 | Yoon | ..................... | H05K 9/0022 |
| 2021/0399413 A1* | 12/2021 | Liao | ....................... | H01Q 1/02 |

FOREIGN PATENT DOCUMENTS

| | | |
|---|---|---|
| KR | 1020160026333 A | 3/2016 |
| KR | 1020170100975 A | 9/2017 |
| KR | 1020180015337 A | 2/2018 |
| KR | 1020180109615 A | 10/2018 |
| KR | 1020190098606 A | 8/2019 |
| KR | 102043396 B1 | 11/2019 |
| KR | 1020200017115 A | 2/2020 |

* cited by examiner

ELECTRONIC DEVICE INCLUDING SHIELDING AND HEAT DISSIPATION STRUCTURE

CROSS-REFERENCE TO RELATED APPLICATIONS

This application is a continuation application of International Application No. PCT/KR2021/009578 designating the United States, filed on Jul. 23, 2021, at the Korean Intellectual Property Receiving Office and claiming priority to Korean Patent Application No. 10-2020-0096360 filed on Jul. 31, 2020, at the Korean Intellectual Property Office, the disclosures of which are incorporated by reference herein in their entireties.

BACKGROUND

Field

Embodiments disclosed herein relate to an electronic device which shields noise caused by an electronic component included in the electronic device, and efficiently diffuses heat generated by the electronic component.

Description of the Related Art

A mobile device such as a smartphone or a tablet is equipped with various electronic components in order to support high performance and various communication schemes. For example, smartphones are equipped with processors having high processing rates, and include antennas for 3G or 4G communication, antennas for Wi-Fi or Bluetooth communication, antennas for near field communication (NFC) for supporting mobile payment, antennas for magnetic secure transmission (MST) communication, or wireless charging coils for supporting wireless charging. Smartphones equipped with patch array antennas for supporting 5G communication are also available.

When a processor is heavily loaded by a continuous operation, or when a mobile device continuously consumes power for communication, strong heat is generated by relevant components or antenna radiators. High temperatures adversely affect the operation of multiple components included in an electronic device. Thus, the electronic device may thus include a heat dissipation means for dissipating heat from the inside of the device to the outside of the device, or diffusing heat from a high-temperature spot of the device to a low-temperature spot of the device.

In addition, electronic components included in the mobile device perform communication through a specific interface, and an appropriate electronic shielding means may be provided such that signals used for the communication do not influence other components. A shield can as an electrical shield for covering electronic components is typically used to prevent electrical signals from leaking from the electronic components to the outside thereof, and to prevent external electrical signals from affecting the operation of the electronic components within an electronic device.

A heat diffusion member such as a heat dissipation plate inevitably occupies some space in the limited mounting space of an electronic device, such that positioning of such heat dissipation member is considered in view of the overall thickness/size of the electronic device.

In addition, electronic components may be surrounded by a shield to effectively shield (electronic) noise related to the electronic components. Electronic components may be positioned inside the shield can, and a heat dissipation plate may be positioned outside the shield can for heat diffusion. Therefore, in order to accomplish both heat dissipation and shielding of electronic components, effective disposition of the shielding member (for example, shield can) and the heat dissipation member (for example, heat dissipation plate) within the electronic device is considered.

Various embodiments disclosed herein may provide an electronic device having both a simplified structure, together with improved heat dissipation and shielding performances.

SUMMARY

An electronic device according to an embodiment disclosed herein may include a housing, a printed circuit board (PCB) disposed in the housing, a first electronic component disposed on the PCB, and a shield can be configured to surround an area in which the first electronic component is disposed. The shield can may have a side wall and an upper surface extending from the side wall, and an opening may be formed in an area on the upper surface of the shield can, the area corresponding to an upper surface of the first electronic component. In addition, the electronic device may include a heat diffusion material applied to the upper surface of the first electronic component, and a shielding sheet disposed to cover the upper surface of the shield can and the upper surface of the first electronic component, to which the heat diffusion material has been applied. In addition, the shielding sheet may include a first heat diffusion member configured to contact the heat diffusion material and disposed inside the opening of the shield can, a second heat diffusion member configured to contact the upper surface of the shield can and the first heat diffusion member, and an adhesive layer disposed between the second heat diffusion member, the upper surface of the shield can, and the first heat diffusion member.

A mobile communication device according to an embodiment disclosed herein may include a frame structure configured to form a side surface of the mobile communication device, a rear cover coupled to the frame structure so as to form a rear surface of the mobile communication device, an antenna module attached to the rear cover, a printed circuit board (PCB) disposed in a containing space formed by the frame structure, below the antenna module, a first electronic component disposed on the PCB, and a shield can configured to surround an area in which the first electronic component is disposed. The shield can may have a side wall and an upper surface extending from the side wall, and an opening may be formed in an area on the upper surface of the shield can, the area corresponding to an upper surface of the first electronic component. The mobile communication device may also include a heat diffusion material applied to the upper surface of the first electronic component, and a shielding sheet disposed to cover the upper surface of the shield can and the upper surface of the first electronic component, to which the heat diffusion material has been applied. The shielding sheet may include a first heat diffusion member configured to contact the heat diffusion material and disposed inside the opening of the shield can, a second heat diffusion member configured to contact the upper surface of the shield can and the first heat diffusion member, and an adhesive layer disposed between the second heat diffusion member, the upper surface of the shield can, and the first heat diffusion member. The shielding sheet and the antenna module may be spaced apart by a designated air gap.

According to various embodiments disclosed herein, an electronic device which has both heat dissipation and shielding effects, and which can be easily assembled, may be provided.

According to various embodiments disclosed herein, an electronic device may have a simplified structure and may thus be compact.

According to various embodiments disclosed herein, an antenna module adjacent to an electronic component may be utilized as a heat dissipation structure, thereby improving heat dissipation performance.

Various other advantageous effects identified explicitly or implicitly through the disclosure may be provided.

BRIEF DESCRIPTION OF THE DRAWINGS

The above and other advantages and features of this disclosure will become more apparent by describing in further detail embodiments thereof with reference to the accompanying drawings, in which.

In connection with description of the drawings, identical or similar components may be given identical or similar reference numerals.

DETAILED DESCRIPTION

Hereinafter, various embodiments of the disclosure will be described with reference to the accompanying drawings.

However, this is not for the purpose of limiting the disclosure to specific embodiments, and is to be understood as encompassing various modifications, equivalents, and/or alternatives to embodiments of the disclosure.

Figure 1:
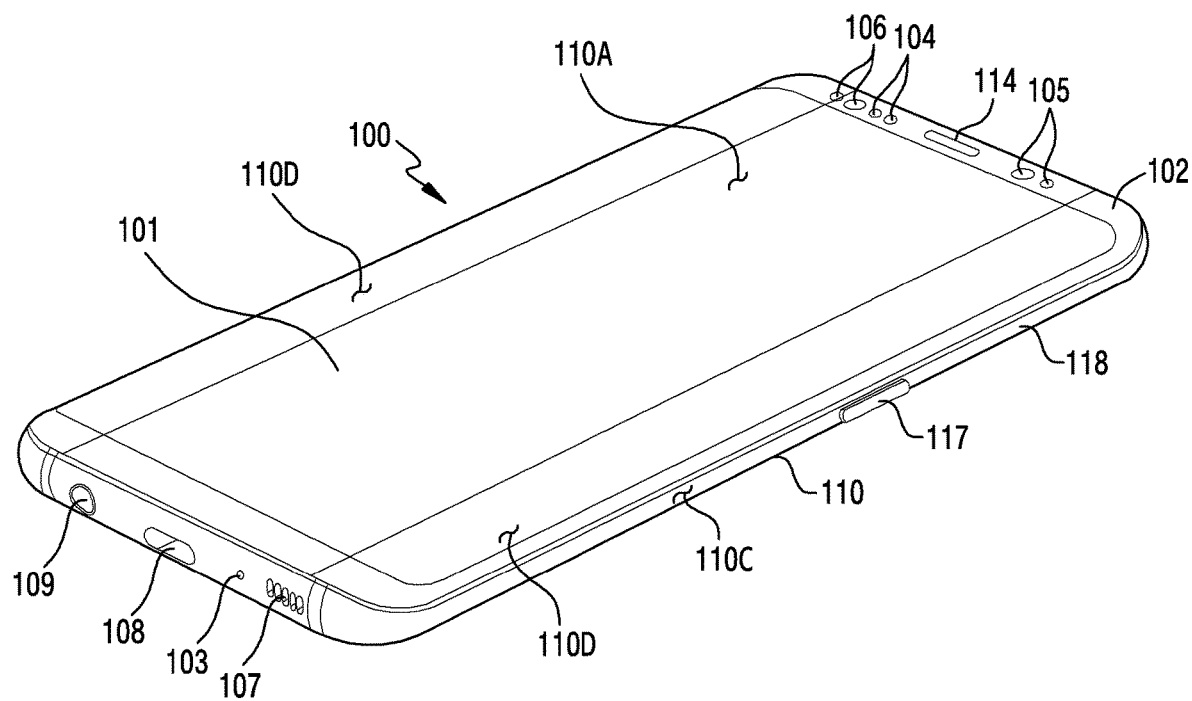
FIG. 1 is a front perspective view of an electronic device according to an embodiment.
Figure 2:
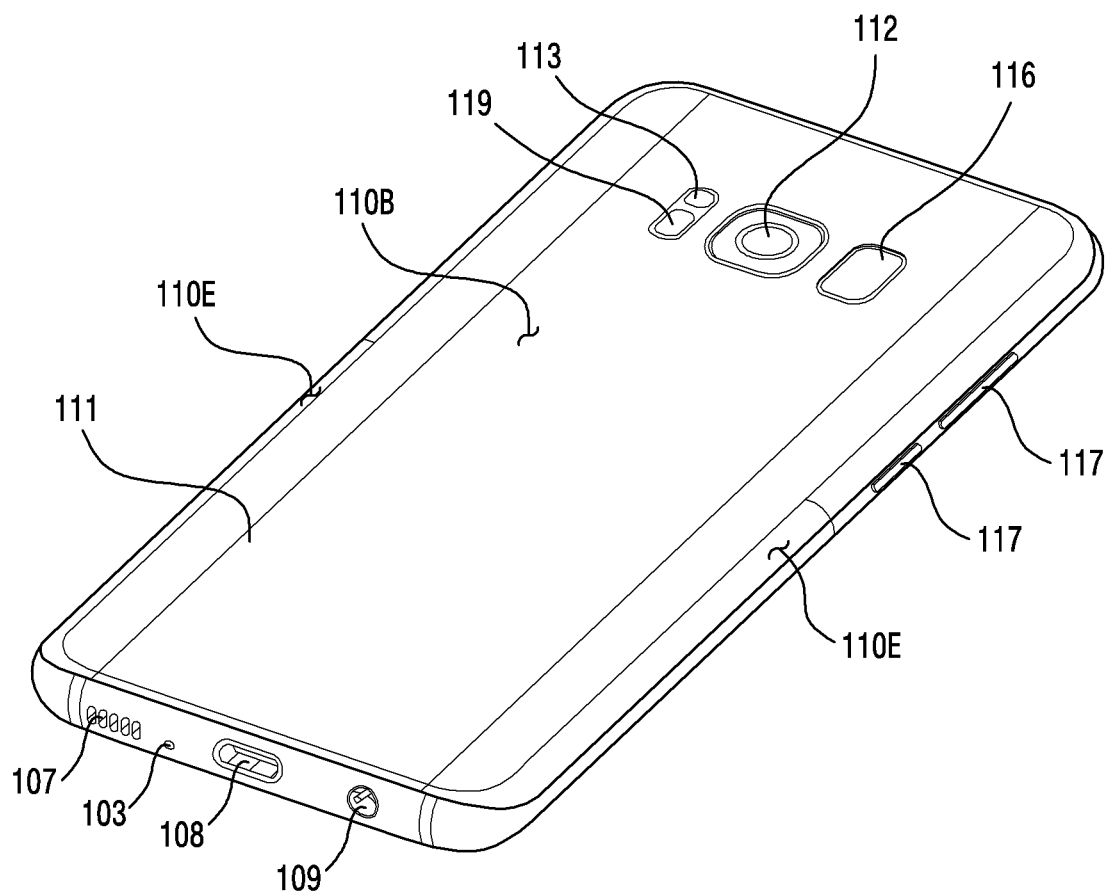
FIG. 2 is a rear perspective view of the electronic device in FIG. 1.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may refer to a structure that forms at least some of the first surface 110A, the second surface 110B, and the side surface 110C in FIG. 1.

According to an embodiment, the first surface 110A may be formed (or provided) by a front plate 102 (for example, glass plate including various coating layers, or polymer plate), at least a part of which is substantially transparent. The second surface 110B may be formed by a substantially opaque rear plate 111. The rear plate 111 may be formed by, for example, coated or colored glass, ceramic, polymer, metal (for example, aluminum, stainless steel (STS), or magnesium), or a combination of at least two of the above materials.

The side surface 110C may be formed by a side bezel structure (or "side member") 118 which is coupled to the front plate 102 and the rear plate 111, and which includes a metal and/or a polymer. In an embodiment, the rear plate 111 and the side bezel structure 118 may be integrally formed and may include the same material (for example, metal material such as aluminum).

In the illustrated embodiment, the front plate 102 may include two first areas 110D extending seamlessly from the first surface 110A (e.g., a border there between being visually non-recognizable) so as to bend from the first surface 110A toward the rear plate 111, at both long edge ends of the front plate 102. In the illustrated embodiment (see FIG. 2), the rear plate 111 may include two second areas 110E extending seamlessly from the second surface 110B so as to bend from the second surface 110B toward the front plate 102, at both long edge ends thereof. In an embodiment, the front plate 102 (or the rear plate 111) may include only one of the first areas 110E (or the second areas 110E) at a respective side of the electronic device 100. In another embodiment, some of the first areas 110E or the second areas 110E may not be included (e.g., may be omitted). In the above embodiments, when seen from the side surface of the electronic device 100 (e.g., in side view), the side bezel structure 118 may have a first thickness (or width) in connection with a part of the side surface not including the above-mentioned first areas 110D or second areas 110E, and may have a second thickness smaller than the first thickness in connection with a part of the side surface including the above-mentioned first areas 110D or second areas 110E.

According to an embodiment, the electronic device 100 may include at least one of a display 101, audio modules 103, 107 and 114, sensor modules 104, 116 and 119, camera modules 105, 112 and 113, a key input device 117, a light-emitting element 106, and connector holes 108 and 109. In an embodiment, at least one (for example, key input device 117 or light-emitting element 106) of the components of the electronic device 100 may be omitted, or another component may be additionally included.

The display 101 may be exposed through a corresponding portion of the front plate 102, for example. In an embodiment, at least a part of the display 101 may be exposed through the front plate 102 that forms the first surface 110A and the first areas 110D of the side surface 110C, to be visually recognizable from outside of the electronic device 100. In an embodiment, the display 101 may have a corner formed in substantially the same shape as an adjacent outer periphery of the front plate 102. In another embodiment (not illustrated), in order to expand the area of exposure of the display 101, the interval between the outer periphery of the display 101 and the outer periphery of the front plate 102 may be substantially constant.

The surface (or front plate 102) of the housing 110 may include a screen display area at which the display 101 is visually exposed and/or recognizable from outside the electronic device 100. For example, the screen display area may include the first surface 110A, and the first areas 110D corresponding to edges.

In another embodiment (not illustrated), the display 101 may have a recess or an opening formed in a part of the screen display area thereof, and may include at least one of an audio module 114, a sensor module 104, a camera module 105, and a light-emitting element 106 aligned with the recess or the opening. In another embodiment (not illustrated), the display 101 may include at least one of an audio module 114, a sensor module 104, a camera module 105, a fingerprint sensor 116, and a light-emitting element 106 on the back surface of the screen display area thereof. In another embodiment (not illustrated), the display 101 may be coupled to or disposed adjacent to a touch sensing circuit, a pressure sensor capable of measuring the intensity (pressure) of an external input such as a touch, and/or a digitizer for detecting a stylus pen as an input tool of a magnetic field type. In an embodiment, at least a part of the sensor modules 104 and 119, and/or at least some of the key input devices 117 may be disposed in the first areas 110D and/or the second areas 110E.

The audio modules 103, 107 and 114 may include a microphone hole 103 and speaker holes 107 and 114. A microphone for acquiring external sounds may be disposed in the microphone hole 103, and multiple microphones may be disposed therein such that the direction of sounds can be sensed, in an embodiment. The speaker holes 107 and 114 may include an external speaker hole 107 and a communication receiver hole 114. In an embodiment, the speaker holes 107 and 114 and the microphone hole 103 may be implemented as a single hole, or a speaker (for example, piezo speaker) may be included without speaker holes 107 and 114. The audio modules 103, 107 and 114 are not limited to the above structure, and may be variously-design-changed, such as mounting only some audio modules or adding a new audio module, according to the structure of the electronic device 100.

The sensor modules 104, 116 and 119 may generate electric signals or data values corresponding to the internal operating state of the electronic device 100, or the external environment state. The sensor modules 104, 116 and 119 may include, for example, a first sensor module 104 (for example, proximity sensor) and/or a second sensor module (not illustrated) (for example, fingerprint sensor) disposed on the first surface 110A of the housing 110, and/or a third sensor module 119 (for example, HRM sensor) and/or a fourth sensor module 116 (for example, fingerprint sensor) disposed on the second surface 110B of the housing 110. The fingerprint sensor may be disposed not only on the first surface 110A (for example, display 101) of the housing 110, but also on the second surface 110B thereof.

The electronic device 100 may further include a sensor module (not illustrated), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104. The sensor modules (not illustrated) are not limited to the enumerated sensors, and may be variously-design-changed, such as mounting only some sensor modules or adding a new sensor module, according to the structure of the electronic device 100.

The camera modules 105, 112 and 113 may include a first camera device 105 disposed on the first surface 110A of the electronic device 100, and a second camera device 112 and/or a flash 113 disposed on the second surface 110B thereof. The camera devices 105 and 112 may include one or more lenses, an image sensor, and/or an image signal processor. The flash 113 may include, for example, a light-emitting diode or a xenon lamp. In an embodiment, two or more lenses (infrared camera, wide-angle and telephoto lenses) and image sensors may be disposed on one surface of the electronic device 100.

In an embodiment, the electronic device 100 may include multiple camera modules (for example, dual camera or triple camera) having different attributes (for example, angle of view) or functions. For example, at least one of the camera devices 105 and 112 may be a wide-angle camera, and at least another thereof may be a telephoto camera. Similarly, at least one of the camera devices 105 and 112 may be a front camera, and at least another thereof may be a rear camera. In addition, the camera devices 105 and 112 may include at least one of a wide-angle camera, a telephoto camera, or an infrared (IR) camera (for example, time of flight (TOF) camera, structured light camera). According to an embodiment, the IR camera may operate as at least a part of a sensor module. For example, the TOP camera may operate as at least a part of a sensor module (not illustrated) for sensing the distance from a subject. The camera modules 105, 112 and 113 are not limited to the above structure, and may be variously-design-changed such as mounting only some camera modules or adding a new camera module, according to the structure of the electronic device 100.

Key input devices 117 may be disposed on the side surface 110C of the housing 110. In another embodiment, the electronic device 100 may not include some or all of the above-mentioned key input devices 117, and key input devices 117 not included therein may be implemented in other types, for example, soft keys, on the display 101. In an embodiment, the key input devices may include a sensor module 116 disposed on the second surface 110B of the housing 110.

The light-emitting element 106 may be disposed on the first surface 110A of the housing 110, for example. The light-emitting element 106 may provide state information of the electronic device 100 in an optical type. In another embodiment, the light-emitting element 106 may provide a light source that interworks with the operation of the camera module 105, for example. The light-emitting element 106 may include, for example, an LED, an IR LED, and a xenon lamp.

The connector holes 108 and 109 may include a first connector hole 108 capable of receiving a connector (for example, USB connector) for transmitting/receiving power and/or data with an external electronic device, and a second connector hole (for example, earphone jack) 109 capable of receiving a connector for transmitting/receiving audio signals with the external electronic device.

The camera module 105 and/or the sensor modules (not illustrated) may be disposed in the inner space of the electronic device 100 to be able to contact the external environment through a designated area of the display 101 and the front plate 102. That is the various modules may be exposed to the external environment (e.g., optically, thermally, mechanically, etc.) by the designated area. For example, the designated area may be an area of the display 101 in which no pixels are disposed (e.g., a non-display area). As another example, the designated area may be an area of the display 101 in which pixels are disposed (e.g., a display region). When seen from above the display 101, at least a part of the designated area may overlap the camera module 105 and/or the sensor modules. As another example, some sensor modules may be disposed in the inner space of the electronic device 100 so as to perform functions without being visually exposed through the front plate 102.

Figure 3:
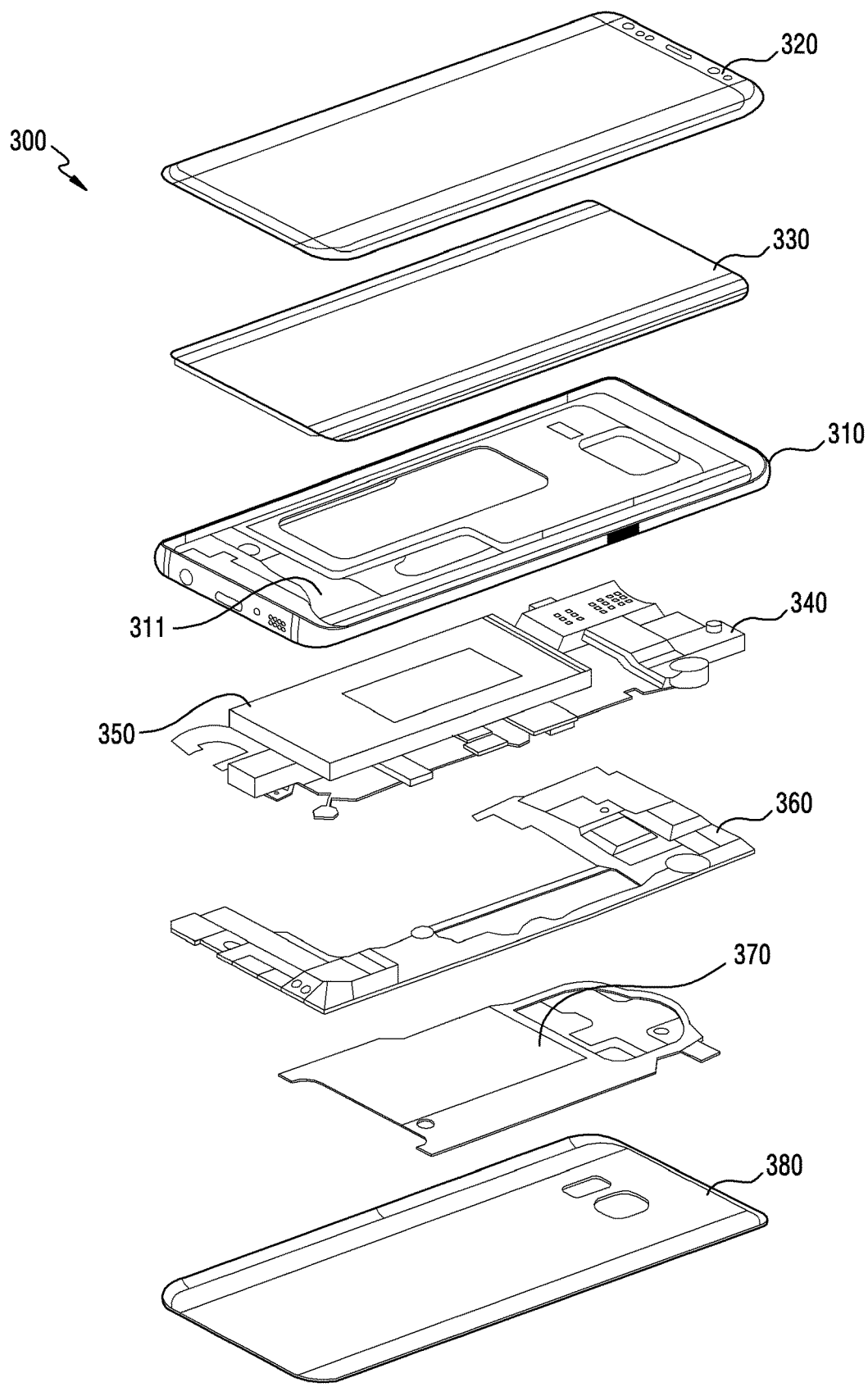
FIG. 3 is an exploded perspective view of the electronic device in FIG. 1.

Referring to FIG. 3, the electronic device 300 may include a side bezel structure 310, a first support member 311 (for example, bracket), a front plate 320, a display 330, a printed circuit board 340, a battery 350, a second support member 360 (for example, rear case), an antenna 370, and a rear plate 380. In an embodiment, at least one (for example, first support member 311 or second support member 360) of the components of the electronic device 300 may be omitted, or another component may be additionally included. At least one of the components of the electronic device 300 may be identical or similar to at least one of the components of the electronic device 100 in FIG. 1 or FIG. 2, and repeated descriptions thereof will be omitted herein.

The first support member 311 may be disposed inside the electronic device 300 and connected to the side bezel structure 310, or may be formed integrally with the side bezel structure 310. The first support member 311 may be made of (or include), for example, a metal material and/or a nonmetal (for example, polymer) material. The display 330 may be coupled to one surface of the first support member 311, and the printed circuit board 340 may be coupled to the other surface thereof which is opposite to the one surface.

A processor, a memory, and/or an interface may be mounted on the printed circuit board 340. The processor may include, for example, one or more among a central processing unit, an application processor, a graphic processing unit, an image signal processor, a sensor hub processor, or a communication processor. The printed circuit board 340 may include a flexible printed circuit board type radio frequency cable (FRC). For example, the printed circuit board 340 may be disposed on at least a part of the first support member 311, and may be electrically connected to an antenna module (for example, antenna module 497 in FIG. 4) and a communication module (for example, communication module 490 in FIG. 4).

The memory may include, for example, a volatile memory or a nonvolatile memory.

The interface may include, for example, a high definition multimedia interface (HDMI), a universal serial bus (USB) interface, an SD card interface, and/or an audio interface. The interface may connect, for example, the electronic device 300 to an external electronic device electrically or physically, and may include a USB connector, an SD card/MMC connector, or an audio connector.

The battery 350 is a device for supplying power to a least one component of the electronic device 300 and may include, for example, a primary battery that is not rechargeable, a secondary battery that is rechargeable, or a fuel cell. At least a part of the battery 350 may be disposed on substantially the same plane (e.g., coplanar) with the printed circuit board 340, for example. The battery 350 may be disposed integrally inside the electronic device 300, or may be disposed such that the same can be attached to/detached from the electronic device 300.

The second support member 360 (for example, rear case) may be disposed between the printed circuit board 340 and the antenna 370. For example, the second support member 360 may include a surface to which at least one of the printed circuit board 340 or the battery 350 is coupled, and another surface to which the antenna 370 is coupled.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may, for example, conduct short-range communication with an external device or wirelessly transmit/receive power necessary for charging. For example, the antenna 370 may include a coil for wireless charging. In another embodiment, a part or a combination of the side bezel structure 310 and/or the first support member 311 may form an antenna structure.

Figure 4:
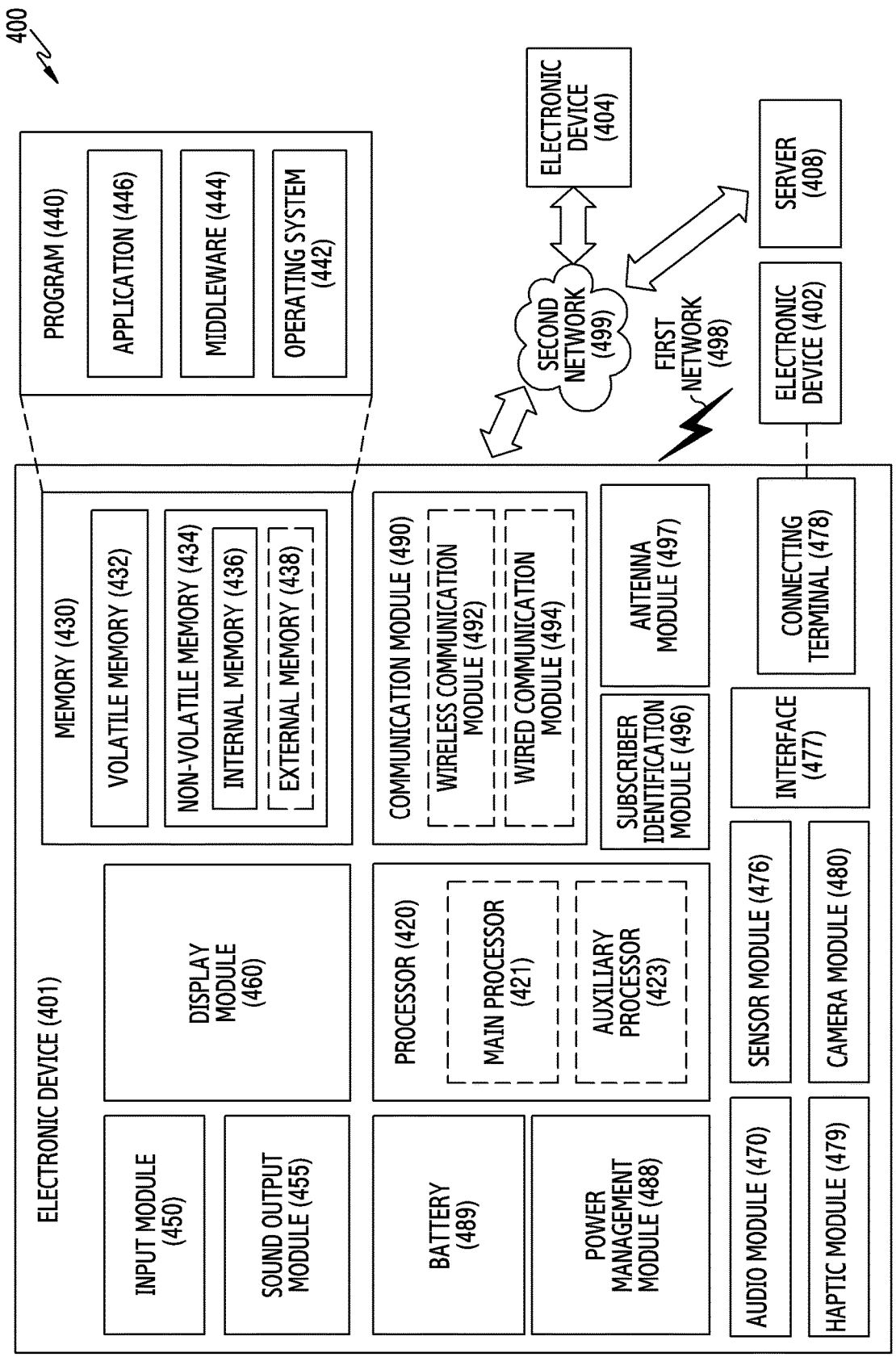
FIG. 4 is a block diagram of an electronic device inside a network environment according to an embodiment.

FIG. 4 illustrates an electronic device 401 inside a network environment 400 according to an embodiment.

Referring to FIG. 4, the electronic device 401 inside the network environment 400 may communicate with an electronic device 402 through a first network 498 (for example, short-range wireless communication network) or may communicate with an electronic device 404 or a server 408 through a second network 499 (for example, long-range wireless communication network). According to an embodiment, the electronic device 401 may communicate with the electronic device 404 through the server 408.

According to an embodiment, the electronic device 401 may include a processor 420, a memory 430, an input module 450, a sound output module 455, a display module 460, an audio module 470, a sensor module 476, an interface 477, a connecting terminal 478, a haptic module 479, a camera module 480, a power management module 488, a battery 489, a communication module 490, a subscriber identification module 496, or an antenna module 497. In an embodiment, at least one (for example, connecting terminal 478) of the components of the electronic device 401 may be omitted, or one or more other components may be added thereto. In an embodiment, some components (for example, sensor module 476, camera module 480, or antenna module 497) may be integrated into a single component (for example, display module 460).

The processor 420 may, for example, execute software (for example, program 440) so as to control at least one other component (for example, hardware or software component) of the electronic device 401 connected to the processor 420, and may perform various kinds of data processing or operation. According to an embodiment, as at least a part of data processing or operation, the processor 420 may store a command or data received from another component (for example, sensor module 476 or communication module 490) in a volatile memory 432, may process the command or data stored in the volatile memory 432, and may store result data in a nonvolatile memory 434. According to an embodiment, the processor 420 may include a main processor 421 (for example, central processing unit or application processor) or an auxiliary processor 423 (for example, graphic processing unit, neural processing unit (NPU), image signal processor, sensor hub processor, or communication processor) capable of operating independently or together with the same. For example, when the electronic device 401 includes the main processor 421 and the auxiliary processor 423, the auxiliary processor 423 may be configured to use less power than the main processor 421 or to be tailored to a designated function. The auxiliary processor 423 may be implemented separately from or as a part of the main processor 421.

The auxiliary processor 423 may control at least some of functions or states related to at least one component (for example, display module 460, sensor module 476, or communication module 490) among the components of the electronic device 401 in place of the main processor 421 while the main processor 421 is in an inactive (for example, sleep) state, for example, or together with the main processor 421 while the main processor 421 is in an active (for example, application executing) state. According to an embodiment, the auxiliary processor 423 (for example, image signal processor or communication processor) may be implemented as a part of another component (for example, camera module 480 or communication module 490) functionally related thereto.

According to an embodiment, the auxiliary processor 423 (for example, neural processing unit) may include a hardware structure customized to artificial intelligence model processing. The artificial intelligence model may be generated through machine learning. Such learning may be performed by the electronic device 401 itself, for example, in which artificial intelligence is performed, or may be performed by a separate server (for example, server 408). Learning algorithms may include, for example, supervised learning, unsupervised learning, semi-supervised learning, or reinforcement learning, but are not limited to the above-mentioned examples. The artificial intelligence model may include multiple artificial neural network layers. The artificial neural network may be one of a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-networks, or a combination of two or more thereof, but is not limited to the above-mentioned examples. The artificial intelligence model may include a software structure, additionally or alternatively, besides the hardware structure.

The memory 430 may store various pieces of data used by at least one component (for example, processor 420 or sensor module 476) of the electronic device 401. The data may include, for example, software (for example, program 440) and input or output data regarding a command related thereto. The memory 430 may include a volatile memory 432 or a nonvolatile memory 434.

The program 440 may be stored in the memory 430 as software and may include, for example, an operating system 442, middleware 444, or an application 446.

The input module 450 may receive a command or data to be used for a component (for example, processor 420) of the electronic device 401 from the outside (for example, user) of the electronic device 401. The input module 450 may include, for example, a microphone, a mouse, a keyboard, a key (for example, button), or a digital pen (for example, stylus pen).

The sound output module 455 may output sound signals to the outside of the electronic device 401. The sound output module 455 may include, for example, a speaker or a receiver. The speaker may be used for a general purpose, such as multimedia playback or recording playback. The receiver may be used to receive an incoming call. According to an embodiment, the receiver may be implemented separately from or as a part of the speaker.

The display module 460 may visually provide information to the outside (for example, user) of the electronic device 401. The display module 460 may include, for example, a display, a hologram device, or a projector and a control circuit for controlling corresponding devices. According to an embodiment, the display module 460 may include a touch sensor configured to sense a touch, or a pressure sensor configured to measure the strength of a force generated by the touch.

The audio module 470 may convert a sound into an electric signal or vice versa. According to an embodiment, the audio module 470 may acquire sounds through the input module 450 or may output sounds through a sound output module 455, or an external electronic device (for example, electronic device 402) (for example, speaker or headphone) directly or wirelessly connected to the electronic device 401.

The sensor module 476 may sense the operating state (for example, power or temperature) of the electronic device 401 or the external environment state (for example, user state), and may generate an electric signal or a data value corresponding to the sensed state. According to an embodiment, the sensor module 476 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 477 may support one or more designated protocols that may be used to connect the electronic device 401 to an external electronic device (for example, electronic device 4020) directly or wirelessly. According to an embodiment, the interface 477 may include, for example, a high definition multimedia interface (HDMI), a universal serial bus (USB) interface, an SD card interface, or an audio interface.

The connecting terminal 478 may include a connector through which the electronic device 401 may be physically connected to an external electronic device (for example, electronic device 402). According to an embodiment, the connecting terminal 478 may include, for example, an HDMI connector, a USB connector, an SD card connector, or an audio connector (for example, headphone connector).

The haptic module 479 may convert an electric signal into a mechanical stimulus (for example, vibration or movement) that the user may recognize through the tactile or kinesthetic sense, or into an electric stimulus. According to an embodiment, the haptic module 479 may include, for example, a motor, a piezoelectric element, or an electric stimulus device.

The camera module 480 may capture still and moving images. According to an embodiment, the camera module 480 may include one or more lenses, image sensors, image signal processors, or flashes.

The power management module 488 may manage power supplied to the electronic device 401. According to an embodiment, the power management module 488 may be implemented as at least a part of a power management integrated circuit (PMIC), for example.

The battery 489 may supply power to at least one component of the electronic device 401. According to an embodiment, the battery 489 may include, for example, a primary battery that is not rechargeable, a secondary battery that is rechargeable, or a fuel cell.

The communication module 490 may support establishment of a direct (for example, wired) communication channel or a wireless communication channel between the electronic device 401 and an external electronic device (for example, electronic device 402, electronic device 404, or server 408), and communication performed through the established communication channel. The communication module 490 may include one or more communication processors which operate independently of the processor 420

(for example, application processor), and which support direct (for example, wired) communication or wireless communication.

According to an embodiment, the communication module 490 may include a wireless communication module 492 (for example, cellular communication module, short-range wireless communication module, or global navigation satellite system (GNSS) communication module), or a wired communication module 494 (for example, local area network (LAN) communication module, or power line communication module). Among these communication modules, a corresponding communication module may communicate with an external electronic device 404 through a first network 498 (for example, short-range communication network such as Bluetooth, wireless fidelity (Wi-Fi) direct, or infrared data association (IrDA)) or a second network 499 (for example, long-range communication network such as legacy cellular network, 5G network, next-generation communication network, Internet, or computer network (for example, LAN or WAN)). Such communication modules of various kinds may be integrated into a single component (for example, single chip) or may be implemented as multiple components (for example, multiple chips) separate from each other. The wireless communication module 492 may identify or authenticate the electronic device 401 inside a communication network such as the first network 498 or the second network 499 by using subscriber information (for example, IMSI) stored in the subscriber identification module 496.

The wireless communication module 492 may support 5G networks and next-generation communication technologies, after 4G networks, for example, new radio (NR) access technology. The NR access technology may support high-speed transmission of a large amount of data (enhanced mobile broadband (eMBB)), terminal power minimization and multi-terminal access (massive machine type communications (mMTC)), or ultra-reliable and low-latency communications (URLLC). The wireless communication module 492 may support a high-frequency band (for example, mmWave band) in order to accomplish a high data transmission rate, for example. The wireless communication module 492 may support various technologies for securing performance in high-frequency bands, for example, technologies such as beamforming, massive multiple-input and multiple-output (MIMO), full dimensional MIMO (FD-MIMO), array antennas, analog beamforming, or large-scale antennas. The wireless communication module 492 may support various requirements specified in connection with the electronic device 401, an external electronic device (for example, electronic device 404), or a network system (for example, second network 499). According to an embodiment, the wireless communication module 492 may support a peak data rate (for example, 20 Gbps or higher) for implementing eMBB, loss coverage (for example, 164 dB or less) for implementing mMTC, or U-plane latency (for example, 0.5 ms or less in connection with DL and UL, respectively, or 1 ms or less in connection with round trip).

The antenna module 497 may transmit signals or power to the outside (for example, external electronic device) or receive the same from the outside. According to an embodiment, the antenna module 497 may include an antenna including a radiator made of a conductor or a conductive pattern formed on a substrate (for example, PCB). According to an embodiment, the antenna module 497 may include multiple antennas (for example, array antenna). In this case, at least one antenna appropriate for a communication scheme used by a communication network such as the first network 498 or the second network 499 may be selected from the multiple antennas by the communication module 490, for example. Signals or power may be transmitted or received between the communication module 490 and the external electronic device through the at least one selected antenna. According to an embodiment, a component (for example, radio frequency integrated circuit (RFIC)) other than the radiator may be additionally formed as a part of the antenna module 497.

According to various embodiments, the antenna module 497 may form a mmWave antenna module. According to an embodiment, the mmWave antenna module may include a printed circuit board, an RFIC which is disposed on the first surface (for example, lower surface) of the printed circuit board or adjacent thereto, and which can support a designated high-frequency band (for example, mmWave band), and multiple antennas (for example, array antenna) which are disposed on the second surface (for example, upper or side surface) of the printed circuit board or adjacent thereto, and which can transmit or receive signals in the designated high-frequency band.

At least some of the above components may be connected to each other through a communication scheme (for example, bus, general purpose input and output (GPIO), serial peripheral interface (SP), or mobile industry processor interface (MIPI)) between peripheral devices so as to exchange signals (for example, commands or data) with each other.

According to an embodiment, commands or data may be transmitted or received between the electronic device 401 and an external electronic device 404 through the server 408 connected to the second network 499. Each external electronic device 402 or 404 may be the same type of device as the electronic device 401 or a different type of device therefrom. According to an embodiment, all or some of operations performed by the electronic device 401 may be performed by one or more external electronic devices among the external electronic devices 402, 104, or 108. For example, when the electronic device 401 needs to perform a specific function or service automatically or in response to a request of the user or another device, the electronic device 401 may request one or more external electronic devices to perform at least a part of the function or service, instead of or in addition to performing the function or service on its own. Upon receiving the request, one or more external electronic devices may execute at least a part of the request function or service, or an additional function or service related to the request, and may transfer the result of execution to the electronic device 401. The electronic device 401 may provide the result, without modifying the same or after additionally processing the same, as at least a part of a response to the request. To this end, cloud computing, distributed computing, mobile edge computing (MEC), or client-server computing technology may be used, for example. The electronic device 401 may provide an ultra-low-latency service by using distributed computing or MEC, for example.

In another embodiment, the external electronic device 404 may include an Internet of thing (IoT) device. The server 408 may be an intelligent server using machine learning and/or neural network. According to an embodiment, the external electronic device 404 or the server 408 may be included in the second network 499. The electronic device 401 may be applied to an intelligent service (for example, smart home, smart city, smart car, or health care) based on 5G communication technology and IoT-related technology.

Figure 5:
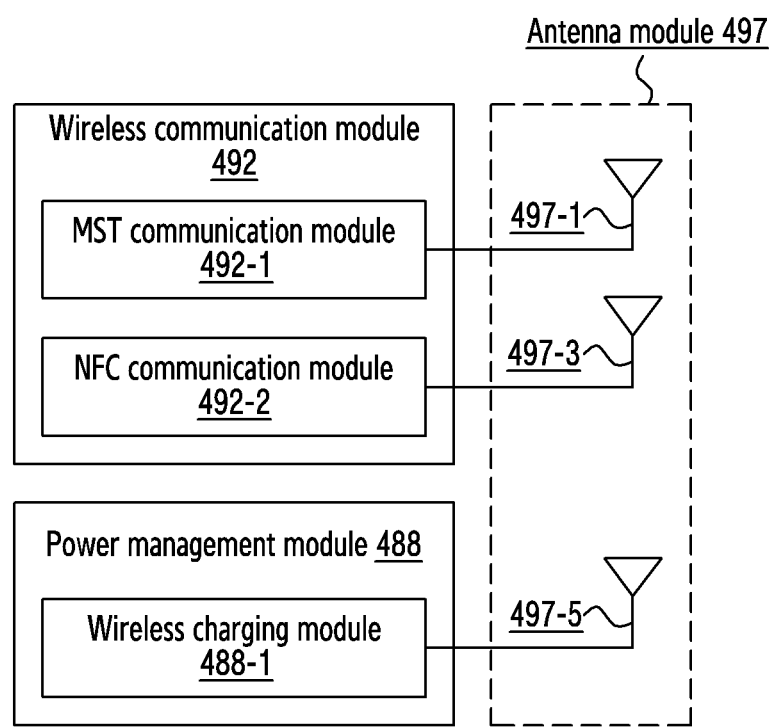
FIG. 5 is a block diagram of a wireless communication module, a power management module, and an antenna module of the electronic device in FIG. 4.

FIG. 5 is a block diagram of a wireless communication module 492, a power management module 488, and an antenna module 497 of an electronic device 401 according to various embodiments. Referring to FIG. 5, the wireless communication module 492 may include an MST communication module 492-1 or NFC communication module 492-2, and the power management module 488 may include a wireless charging module 488-1. In this case, the antenna module 497 may include multiple antennas including an MST antenna 497-1 connected to the MST communication module 492-1, an NFC antenna 497-3 connected to the NFC communication module 492-2, and a wireless charging antenna 497-5 connected to the wireless charging module 488-1. For convenience of description, descriptions of components already described with reference to FIG. 4 will be omitted or abbreviated herein.

The MST communication module 492-1 may receive a signal including control information or payment information (for example, card information) from the processor 420, may generate a magnetic signal corresponding to the received signal through the MST antenna 497-1, and may transfer the generated magnetic signal to an external electronic device 402 (for example, POS device). In order to generate the magnetic signal, according to an embodiment, the MST communication module 492-1 may include a switching module (not illustrated) including one or more switches connected to the MST antenna 497-1, and may control the switching module such that the direction of a voltage or current supplied to the MST antenna 497-1 is changed according to the received signal. The change in direction of the voltage or current enables a corresponding change in direction of a magnetic signal (for example, magnetic field) emitted through the MST antenna 497-1. The direction-changed magnetic signal, if sensed by the external electronic device 402, may cause an effect (for example, waveform) similar to a magnetic field generated by a magnetic card, which corresponds to the received signal (for example, card information), swiped through a card reader. According to an embodiment, payment-related information and control signals received by the electronic device 402 as magnetic signals may be transmitted to an external server 408 (for example, payment server) through a network 499, for example.

The NFC communication module 492-2 may acquire a signal including control information or payment information (for example, card information) from the processor 420, and may transmit the acquired signal to the external electronic device 402 through the NFC antenna 497-3. According to an embodiment, the NFC communication module 492-2 may receive signals emitted from the external electronic device 402 through the NFC antenna 497-3.

The wireless charging module 488-1 may wirelessly transmit power to the external electronic device 402 (for example, mobile phone or wearable device) through the wireless charging antenna 497-5, or may wirelessly receive power from the external electronic device 402 (for example, wireless charging device). The wireless charging module 488-1 may support one or more among various wireless charging types including a magnetic resonance type or a magnetic induction type.

According to an embodiment, at least some antennas among the MST antenna 497-1, the NFC antenna 497-3, or the wireless charging antenna 497-5 may share at least a part of a radiating portion with each other. For example, the radiating portion of the MST antenna 497-1 may be used as the radiating portion of the NFC antenna 497-3 or the wireless charging antenna 497-5, and vice versa. In this case, the antenna module 497 may include a switching circuit (not illustrated) configured to selectively connect (for example, close) or separate (for example, open) at least some of the antennas 497-1, 497-3, or 497-3 under the control of the wireless communication module 492 (for example, MST communication module 492-1 or NFC communication module 492-2) or the power management module 488 (for example, wireless charging module 488-1). For example, when the electronic device 401 uses a wireless charging function, the NFC communication module 492-2 or the wireless charging module 488-1 may control the switching circuit such that at least a partial area of the radiating portion shared by the NFC antenna 497-3 and the wireless charging antenna 497-5 is temporarily separated from the NFC antenna 497-3 and then connected to the wireless charging antenna 497-5.

According to an embodiment, at least one function of the MST communication module 492-1, the NFC communication module 492-2, or the wireless charging module 488-1 may be controlled by an external processor (for example, processor 420). According to an embodiment, designated functions (for example, payment function) of the MST communication module 492-1 or the NFC communication module 492-2 may be performed in a trusted execution environment (TEE). The TEE according to various embodiments may form an execution environment in which at least a part of the designated area of the memory 430 is used to perform a function requiring a relatively high level of security (for example, financial transaction or personal information-related function). In this case, access to the designated area may be allowed in a limited manner according to the accessing entity or the application executed in the TTE, for example.

Figure 6A:
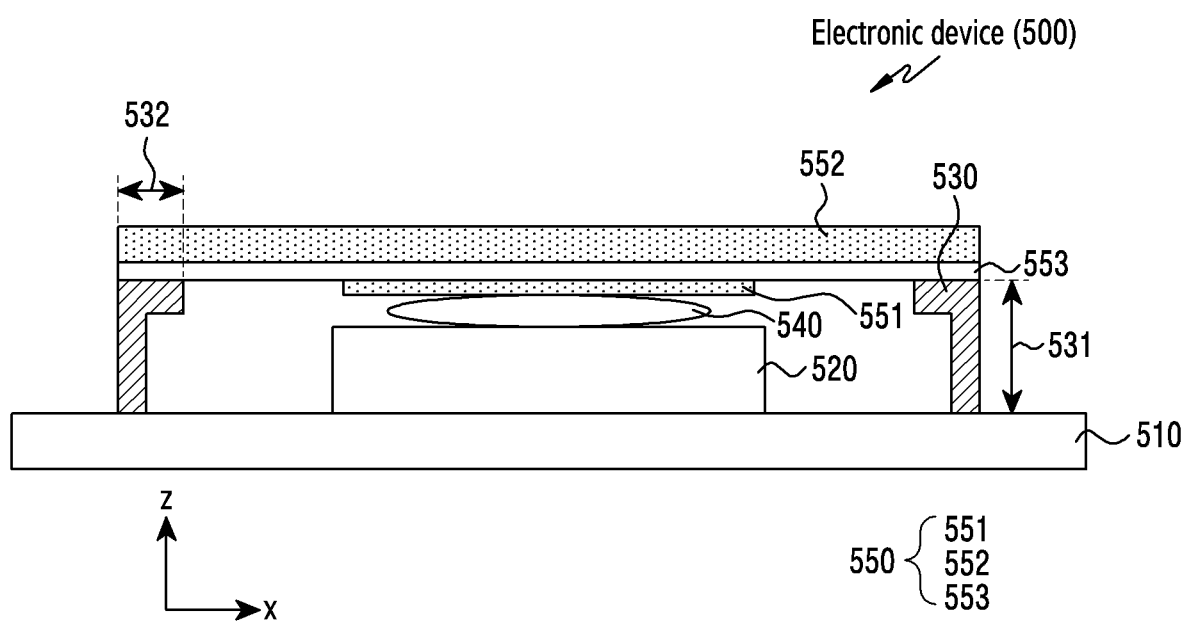
FIG. 6A is a cross-sectional view illustrating heat dissipation and shielding structures of an electronic device according to an embodiment.

FIG. 6A illustrates heat dissipation and shielding structures of an electronic device 500 according to an embodiment.

Referring to FIG. 6A, at least one electronic component may be disposed on the printed circuit board (PCB) 510 of the electronic device 500. It will be assumed in the following description, for convenience of description, that an electronic component 520 is disposed on the PCB 510.

FIG. 6A illustrates the PCB 510, among the components of the electronic device 500, and a portion of the PCB 510, on which components are disposed. The electronic device 500 may be understood as one of the above-described electronic device 100 in FIG. 1, FIG. 2, electronic device 300 in FIG. 3, and electronic device 401 in FIG. 4, FIG. 5, for example. In other words, descriptions of the electronic device 100, electronic device 300, electronic device 401 may be applied to the electronic device 500.

In addition, the electronic device 500 disclosed herein is an example, and does not limit the type of a device to which the technical idea disclosed herein is applied. The technical idea disclosed herein is applicable to various user devices having substrates, electronic components, and heat dissipation/shielding structures described with reference to various drawings. For example, the technical idea disclosed herein may be applied to a foldable electronic device employing a flexible display and a hinge structure such that the same can fold in the transverse direction or fold in the longitudinal direction, an electronic device employing a sliding/rolling structure such that the display can slide or roll, a tablet, or a laptop.

In an embodiment, the electronic device 500 may include a PCB 510 and an electronic component 520 which is disposed on the PCB 510. The PCB 510 may have a die (for example, pad or terminal) designed such that the electronic component 520 is disposed on the surface thereof, and the electronic component 520 may be circuit-wise connected to a signal line or ground line of the PCB 510 through the die.

In an embodiment, the electronic component 520 may be disposed in a predetermined area on the PCB 510, and a shield can 530 may be disposed on the PCB 510 so as to surround the predetermined area. The shield can 530 may be coupled to the PCB 510 by a predetermined fastening structure or surface mount technology (SMT). The area may be a planar area along a plane, such as a plane defined by the x direction and the y direction crossing each other. The planar area may be defined by dimensions of an element which are taken along the plane.

In an embodiment, the shield can 530 may have the shape of a square or a rectangle, but may have an appropriate shape for effectively shielding one or more electronic components. For example, the shield can 530 may have various shapes such as a pentagon, L-shape. The shield can 530 may be made of a metal material having a predetermined rigidity. For example, the shield can 530 may be made of a metal material such as SUS, copper (Cu), nickel (Ni), silver (Ag), gold (Au), aluminum, Nickel silver, or zinc-plated steel plate. In an embodiment, the shield can 530 may have not only a shielding function, but also a heat dissipation function.

In an embodiment, a gasket may be formed on or near a side wall of the shield can 530.

In an embodiment, the shield can 530 may have a side wall 531 surrounding the electronic component 520 in a plan view, that is, a view along the z direction. The side wall 531 may have an appropriate height for shielding the electronic component 520. In addition, the shield can 530 may have an upper surface 532 defined by an upper portion extending from the side wall 531, and an opening may be formed at the upper surface. That is, solid portions of the shield can 530 may define the opening, at the upper surface 532. As used herein, the upper surface of a component may be a surface which is furthest from a reference surface or component, like the PCB 510 in FIG. 6A. The opening of the shield can 530 may be positioned to correspond to the upper surface of the electronic component 520.

In an embodiment, the shield can 530 may surround at least a part of the electronic component 520. The shield can 530 may surround the side surface of the electronic component 520, but the opening may expose the upper surface of the electronic component 520 to outside the shield can 530. A structure for additionally shielding the upper surface of the electronic component 520 will be described later.

In an embodiment, a thermal interface material (TIM) 540 may be applied to the upper surface of the electronic component 520 to define a heat diffusion pattern. The TIM 540 may have liquid-phase characteristics such that the same can be easily applied to the upper surface of the electronic component 520, but is not limited thereto. For example, the TIM 540 may have another form (for example, solid type or tape type) having an appropriate heat transportation ratio. For example, the TIM 540 may include a mixture of thermally conductive particles or carbon fiber and synthetic resin. According to an embodiment, the thermally conductive particles may include aluminum oxide (Al2O3) or aluminum nitride (AlN) particles. According to an embodiment, the synthetic resin of the TIM 540 may include silicone or acrylic-based synthetic resin. According to an embodiment, the carbon fiber of the TIM 540 may be disposed to be aligned in a direction perpendicular to an electric element such that heat generated by the electronic component 520 is easily transferred to the shielding sheet 550. According to an embodiment, the TIM 540 may include a solid or liquid thermal interface material (TIM) having a thermal conductivity in the range of about 2 watts per meter-Kelvin (W/mK) to about 100 W/mK.

In an embodiment, the electronic device 500 may include a shielding sheet 550 for covering the upper surface 532 of the shield can 530 and the upper surface of the electronic component 520 to which the TIM 540 is applied. The shielding sheet 550 may cover at least a partial area of the upper surface 532 of the shield can 530 and the opening area of the shield can 530, thereby preventing noise (for example, electro-magnetic interference (EMI) signal) emitted by the electronic component 520 from escaping out of the space formed by the shield can 530 together with the shielding sheet 550. The shielding sheet may include a metal material (for example, Cu) having a high thermal conductivity in order to accomplish heat dissipation and EMI shielding effects.

In an embodiment, the shielding sheet 550 may include a first heat diffusion member 551, a second heat diffusion member 552, and an adhesive layer 553 disposed between the first heat diffusion member 551 and the second heat diffusion member 552 and attaching the first heat diffusion member 551 and the second heat diffusion member 552 to each other. As used herein, the second diffusion member 552 may also refer to the layers 552 and 553 together with each other.

The first heat diffusion member 551 or the second heat diffusion member 552 may include various thermal interface materials or members for transferring heat generated by the electronic component 520 to the outside (e.g., outside of the shield can 530) or to the cover of the electronic device. For example, the first heat diffusion member 551 or the second heat diffusion member 552 may include copper (Cu), thermal interface material (TIM), heat dissipation sheet, or heat dissipation paint. The material of the heat dissipation sheet or heat dissipation paint may include, for example, a material having a high thermal conductivity, such as graphite, carbon nanotubes, natural regenerated material, silicone, silicon, or graphite. As used herein, a shielding sheet may also be considered as layers 552, 553, 551 and 540 together with each other.

The adhesive layer 553 may be disposed throughout the entire area of the second heat diffusion member 552, that is, be disposed on an entirety of the second heat diffusion member 552. In an embodiment, the adhesive layer 553 may include optical clear adhesive (OCA), optical clear resin (OCR), pressure sensitive adhesive (PSA), heat-reactive adhesive, normal adhesive, or double-sided tape. A predetermined area of the second heat diffusion member 552 may be attached to the first heat diffusion member 551 by the adhesive layer 553, and another area of the second heat diffusion member 552 which excludes the predetermined area may be attached to the upper surface 532 of the shield can 530 thereby. In an embodiment, as illustrated in FIG. 6A, the adhesive layer 553 may be positioned on the lower surface of the second heat diffusion member 552, and a partial area of the adhesive layer 553 may not be attached to any of the shield can 530, the electronic component 520, and the first heat diffusion member 551. That is, a portion of the lower surface of the adhesive layer 553 may remain unattached. As used herein, the lower surface of a component may be a surface which is closest to a reference surface or component, like the PCB 510 in FIG. 6A.

In an embodiment, the first heat diffusion member 551 may be positioned above the electronic component 520 so as to overlap or correspond to the electronic component 520.

The second heat diffusion member 552 may be positioned on the upper surface of the first heat diffusion member 551 and may contact the upper surface of the shield can 530. The first heat diffusion member 551 may be coplanar with the upper portion of the shield can 530 which defines the opening. As used herein, elements that contact each other may form an interface therebetween. In an embodiment, the adhesive layer 553 may not be applied to a partial area of the second heat diffusion member 552 where the lower surface of the adhesive layer 553 is unattached. For process convenience, however, the adhesive layer 553 may be applied to the entire area of the second heat diffusion member 552.

In a comparative embodiment in which the first heat diffusion member 551 does not exist, the adhesive layer 553 applied to the second heat diffusion member 552 may contact the thermal interface material 540 and/or the upper surface of the electronic component 520. However, the second heat diffusion member 552, which is attached on the upper surface of the shield can 530, may be somewhat spaced apart from the upper surface of the electronic component 520 due to a height difference, and as a result of this, the upper surface may contact and then detach from a partial area of the electronic component 520 and the adhesive layer 553 in a situation in which the electronic device 500 is pressed or not pressed. Consequently, noise generation, durability degradation, or loss of the thermal interface material 540 may occur. However, in one or more embodiment disclosed herein, the first heat diffusion member 551 may be disposed below the second heat diffusion member 552 and closer to the electronic component 520 than the second heat diffusion member 552, such that the first heat diffusion member 551 contacts the upper surface of the electronic component 520, thereby preventing the above-mentioned noise generation, durability degradation, or loss of the thermal interface material 540.

In an embodiment, the shielding sheet 550 may be formed integrally. For example, the shielding sheet 550 may include the first heat diffusion member 551, the second heat diffusion member 552, and the adhesive layer 553 formed integrally. By extending the shielding sheet 550 from inside the shielding can 530, through the opening thereof, and attaching the integrally formed shielding sheet 550 onto the upper surface 532 of the shield can 530, heat dissipation/shielding performance identical to or better than that of the prior art may be accomplished while having a relatively simple structure of the shield can 530.

A size of a component may refer to a planar area thereof and/or a thickness thereof, without being limited thereto. In an embodiment, the first heat diffusion member 551 may have a size (e.g., a planar area) smaller than a planar area of the opening of the shield can 530. For example, when the opening of the shield can 530 has a first size, the first heat diffusion member 551 may have a second size which is smaller than the first size. By forming the first heat diffusion member 551 so as to have a size smaller than that of the opening of the shield can 530, the first heat diffusion member 551 may be disposed in the opening of the upper surface of the shield can 530 so as not to extend out of the opening and protrude from the upper surface of the shield can 530. That is, the first heat diffusion member 551 may be spaced apart from the periphery of the opening of the shield can 530, where the periphery is defined by an inner surface or inner sidewall which defines the opening.

In an embodiment, the size of the upper surface of the electronic component 520 may be larger than the size (first size) of the opening of the shield can 530. In another embodiment, the size of the upper surface of the electronic component 520 may be smaller than the size (first size) of the opening of the shield can 530, but may be larger than or substantially identical to the size (second size) of the first heat diffusion member 551. In another embodiment, the size of the upper surface of the electronic component 520 may be smaller than the size (second size) of the first heat diffusion member 551. For example, when multiple electronic components are disposed in the shield can 530, the first heat diffusion member 551 may have a size sufficient to cover the surface of at least two electronic components. As used herein, an element which covers another element may have a planar size equal to or larger than a planar size of the another element, without being limited thereto.

In an embodiment, the size of the area in which the thermal interface material 540 is applied may be smaller than or equal to the size of the upper surface of the electronic component 520. That is, a portion of the upper surface of the electronic component 520 may be exposed to outside the thermal interface material 540. In another embodiment, the size of the upper surface of the electronic component 520 and the second size of the first heat diffusion member 551 may be formed substantially identical. The thermal interface material 540 may be applied so as to cover the entire upper surface of the electronic component 520, but may also be applied in a discrete shape like an X-shape, O-shape, or a discrete pattern (for example, zigzag, check, helical, or the like) appropriate for heat transportation from the upper surface of the electronic component 520.

Referring to FIG. 6A, signals (e.g., electrical signals) directed to the lateral surface, among noise generated by the electronic component 520, may be shielded by the shield can 530, such as at the sidewall portion including the solid vertical portions which define the side wall 531 and the solid horizontal portions which define the upper surface 532. In addition, signals directed to the upper surface, among noise generated by the electronic component 520, may be shielded by the shielding sheet 550. Particularly, the upper surface of the electronic component 520, which may generate the strongest signal in the electronic component 520, and which is closest to the shielding member, may be double-shielded by the first heat diffusion member 551 and the second heat diffusion member 552, thereby maximizing the noise shielding effect.

Figure 6B:
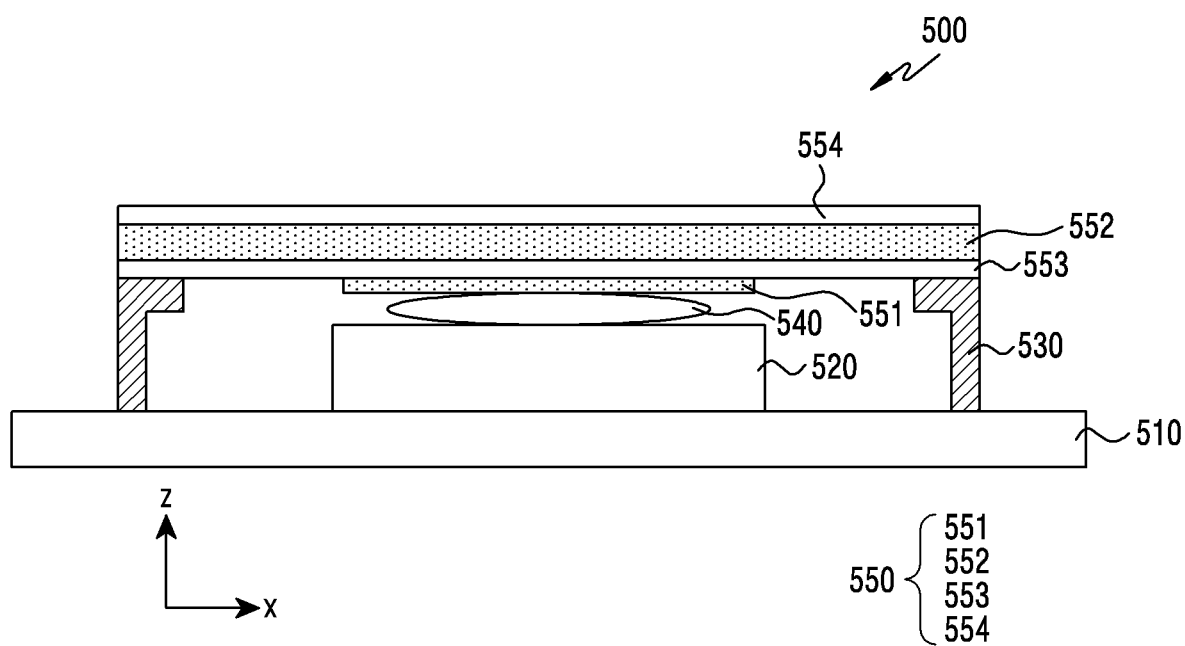
FIG. 6B is a cross-sectional view illustrating heat dissipation and shielding structures of an electronic device including a shielding sheet having an insulating layer according to an embodiment.

FIG. 6B illustrates heat dissipation and shielding structures of an electronic device 500 including a shielding sheet having an insulating layer according to an embodiment.

In an embodiment, the shielding sheet 550 may further include an insulating layer 554 in addition to a first heat diffusion member 551, a second heat diffusion member 552, and an adhesive layer 553. In general, the first heat diffusion member 551 or the second heat diffusion member 552 includes a metal material which has a high thermal conductivity, and which can shield electromagnetic waves. If the surface of the metal material is exposed, corrosion, damage, or unintended short-circuiting with another component may occur. Therefore, when the second heat diffusion member 552 is made of a material such as copper (Cu) or graphite, insulation treatment may be applied to the externally exposed surface.

In an embodiment, the first heat diffusion member 551 may be made of the same material as the second heat diffusion member 552. For example, when the second heat diffusion member 552 is made of Cu, the first heat diffusion member 551 may be made of Cu as well. However, this is only an example, and the first heat diffusion member 551 may be made of a material different from that of the second heat diffusion member 552.

In an embodiment, insulation treatment may not be applied to the first heat diffusion member 551. Among the surfaces of the first heat diffusion member 551, the first surface facing in a first direction (for example, +z direction) may contact the adhesive layer 553, and a second surface facing in a second direction (for example, -z direction) opposite to the first direction may contact the thermal interface material 540. The first surface that contacts the adhesive layer 553 is not exposed to the outside and thus may need no insulation treatment. The second surface that contacts the thermal interface material 540 may have no separate insulating layer between the thermal interface material 540 and the second surface in order to maximize the capability of transporting heat generated by the electronic component 520.

In various embodiments disclosed herein, insulation treatment may be applied to an externally exposed conductive material or heat diffusion member, unless clearly specified as in the case of the first heat diffusion member 551. Insulation treatment (for example, coating) may be directly applied to the conductive material, or an insulating layer may be attached to the conductive material through an adhesive layer/adhesive agent.

Figure 7:
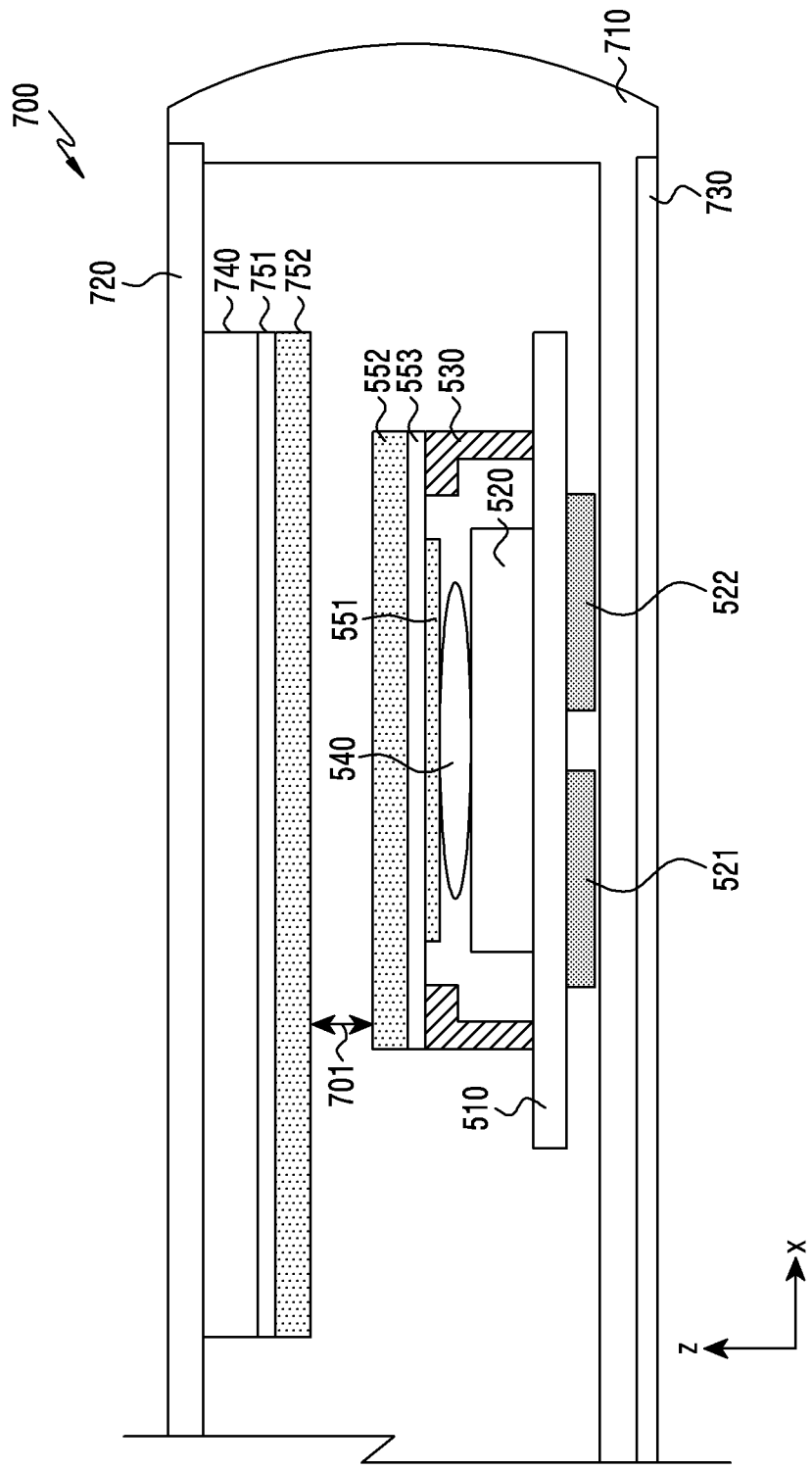
FIG. 7 is a cross-sectional view illustrating heat dissipation and shielding structures of an electronic device having an antenna module according to an embodiment.

FIG. 7 illustrates heat dissipation and shielding structures of an electronic device 700 having an antenna module according to an embodiment.

Referring to FIG. 7, the electronic device 700 may further include an antenna module 740, compared with the electronic device 500. Descriptions regarding the electronic device 500 may be applied to the electronic device 700 as well, identical components described with reference to FIG. 6A and FIG. 6B are given identical reference numerals, and repeated descriptions thereof will be omitted herein.

Referring to FIG. 7, the electronic device 700 may have a housing 710. Multiple electronic components may be disposed in the housing 710, and the same may understood as a frame structure forming at least a part of the exterior of the electronic device 700. In an embodiment, the frame structure may be entirely made of a metal material, may be mainly made of a metal material, while including a part made of an insulating material as well, through a dual injection process. In an embodiment, multiple electronic components may be disposed inside the housing 710. For example, an electronic component 520 may be disposed on a surface of the PCB 510. In addition, one or more electronic components 521 and 522 may be disposed on another surface of the PCB 510. A shielding structure or a heat dissipation structure may be applied to the one or more electronic components 521 and 522 similarly to the electronic component 520.

In the example illustrated in FIG. 7, the housing 710 includes a containing space to provide a receiving space in which the PCB 510 can be seated, and forms the side surface among the exterior of the electronic device 700, but the shape of the housing 710 is not limited thereto. For example, the housing 710 may have a unibody shape in which the side and rear surfaces are formed integrally. In this case, however, the rear surface portion may be made of a nonmetal material (for example, injection) such that the antenna module 740 can radiate through the rear surface of the electronic device 700.

Referring back to FIG. 7, the electronic device 700 may include a housing 710 such that at least a part of the electronic device 700 forms the side surface thereof, and may include a rear cover 720 forming the rear surface of the electronic device 700, a display 730 forming the front surface of the electronic device 700, or a front plate. In an embodiment, the housing 710 may form at least a part of the side surface of the electronic device 700, and the remaining portion of the side surface may be formed by the display 730 or the front plate, which extends from the front surface to the side surface.

With reference to FIG. 7, the first direction (for example, +z direction) as used herein may be understood as being directed toward the rear surface of the electronic device, and the second direction (for example, -z direction) may be understood as being directed toward the front surface of the electronic device.

In an embodiment, the antenna module 740 may be attached to the rear cover 720.

For example, an adhesive layer may exist between the antenna module 740 and the rear cover 720, or an adhesive may be applied therebetween.

In an embodiment, the antenna module 740 may include an antenna radiator for supporting at least one wireless communication scheme and a wireless communication circuit electrically connected to the antenna radiator. The antenna radiator and the wireless communication circuit may be implemented in flexible PCB (FPCB) types. A configuration of the antenna module 740 will be described later with reference to FIG. 8.

In an embodiment, a heat diffusion sheet 752 may be disposed below the antenna module 740. An adhesive layer 751 may exist between the heat diffusion sheet 752 and the antenna module 740.

In an embodiment, the heat diffusion sheet 752 may be made of Cu or graphite. As described with reference to FIG. 6B, insulation treatment may be applied to the externally exposed portion of the heat diffusion sheet 752. For example, an insulating layer may be disposed below the heat diffusion sheet 752.

In an embodiment, the heat diffusion sheet 752 may have a wider area than the antenna module 740. The heat diffusion sheet 752 may have a relatively larger size than the antenna module 740 in order to diffuse heat generated by the antenna module 740 over a wide range.

For example, the heat diffusion sheet 752 may have an area covering multiple shield cans disposed below the heat diffusion sheet 752.

In an embodiment, a predetermined gap may be formed between the antenna module 740 and the shielding sheet 550. As used herein, the antenna module 740 may refer to one or more layers, such as layers 740, 751 and 752 taken together, without being limited thereto. For example, the shielding sheet 550 and the heat diffusion sheet 752 attached below the antenna module 740 may be spaced apart by a predetermined interval 701. For example, the predetermined interval 701 may be a gap between elements along a thickness direction (e.g., the z direction) of about 0.1 millimeter (mm) to about 0.2 mm, but is not limited thereto.

In an embodiment, heat generated by the electronic component 520 may be diffused to the periphery of the heating point through the heat diffusion sheet 752.

In an embodiment, the shielding sheet 550 may receive heat transferred through the thermal interface material 540 from a heat generating device (for example, electronic component 520). When a direct heat transfer path is formed from the electronic component 520 to the antenna module 740, such as when a connecting member is connected between the antenna module 740 and the shielding sheet 550, or when the heat diffusion sheet 752 (or antenna module 740) and the shielding sheet 550 directly contact, heat generated by the electronic component 520 may be transferred to the antenna module 740 through the shielding sheet 550 and the heat diffusion sheet 752. When the shielding sheet 550 and the heat diffusion sheet 752 (or antenna module 740) directly contact, a hot spot may be formed in a partial area of the antenna module 740 and/or the heat diffusion sheet 752. Since the antenna module 740 and/or the heat diffusion sheet 752 are positioned on the rear cover 720, a hot spot may be formed in a partial area of the rear cover 720. According to an embodiment, an air gap corresponding to the predetermined interval 701 may exist between the antenna module 740 and the shielding sheet 550 such that heat transferred through the shielding sheet 550 and/or the heat diffusion sheet 752 is diffused to the periphery through the predetermined interval 701.

Figure 8:
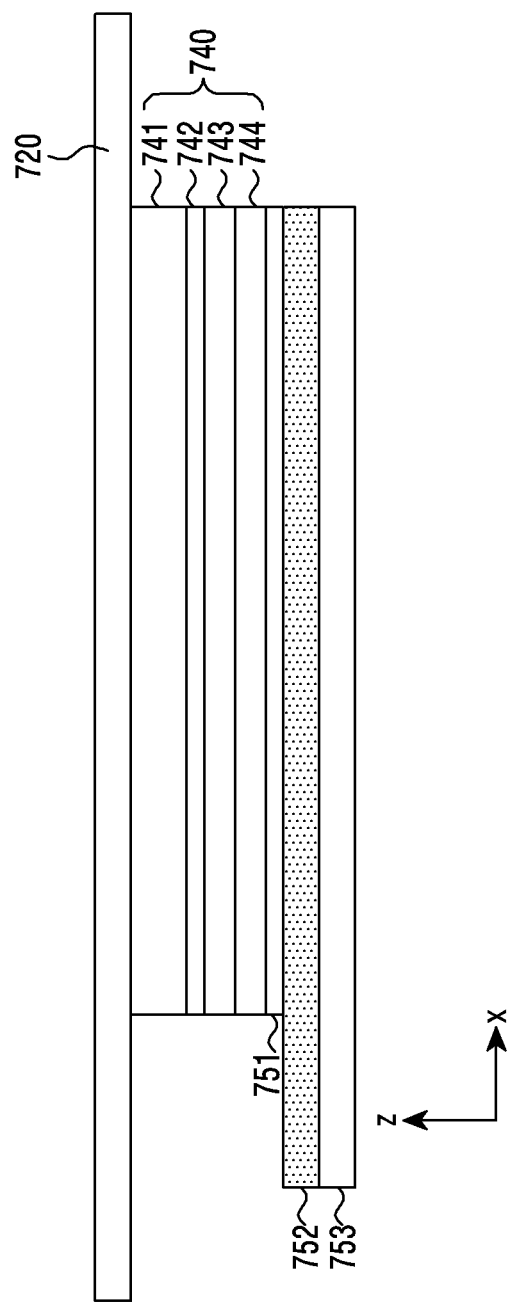
FIG. 8 is a cross-sectional view illustrating the lamination structure of an antenna module according to an embodiment.

FIG. 8 illustrates the lamination structure of an antenna module 740 according to an embodiment.

Referring to FIG. 8, the antenna module 740 may be disposed inside a rear cover 720. The antenna module 740 may include a coil-type antenna radiator which radiates through the rear cover 720, and which occupies a relatively wide area. For example, the antenna module 740 may include at least one of an NFC coil for NFC communication, an MST coil for MST communication, and a WPC coil for wireless power charging (WPC). In addition, the antenna module 740 may include multiple UWB antennas for ultra-wideband (UWB) communication for positioning. The UWB antennas may be spaced apart from each other by a predetermined distance (for example, half the wavelength length of UWB communication signals). It will be assumed in the following description that the antenna module 740 includes a coil-type antenna radiator for NFC communication, but the same is not limited thereto.

In an embodiment, the antenna module 740 may include an FPCB 741 including an antenna radiator and a wireless communication circuit, a ferrite 743 disposed below the FPCB 741, an adhesive layer 742 disposed between the FPCB 741 and the ferrite 743, and/or an insulating layer 744 disposed below the ferrite 743. The ferrite 743 may be understood as a magnetic body capable of suppressing an eddy current that may be generated by the coil-type antenna radiator.

In an embodiment, a heat diffusion sheet 752 may be disposed below the antenna module 740, and an insulating layer 753 may be disposed below the heat diffusion sheet 752. An adhesive layer 751 may be disposed between the heat diffusion sheet 752 and the antenna module 740, for example, the insulating layer 744. Although not illustrated in FIG. 8, an adhesive layer may be disposed between the insulating layer 753 and the heat diffusion sheet 752 as well.

In an embodiment, the heat diffusion sheet 752 may play the role of diffusing heat generated by the antenna radiator, for example, NFC coil. For example, the heat diffusion sheet 752 may diffuse heat generated by the antenna radiator occupying a first area to the entire area of the heat diffusion sheet 752 which includes the first area, and which has a second area much wider than the first area relatively. In addition, the heat diffusion sheet 752 may diffuse heat to the inner space of the electronic device 700 through an air gap positioned below the heat diffusion sheet 752.

Hereinafter, the disposition of a shielding structure, a heat dissipation structure, and an antenna module, applied to an electronic device, will be described with reference to FIG. 9A to FIG. 12B.

Figure 9A:
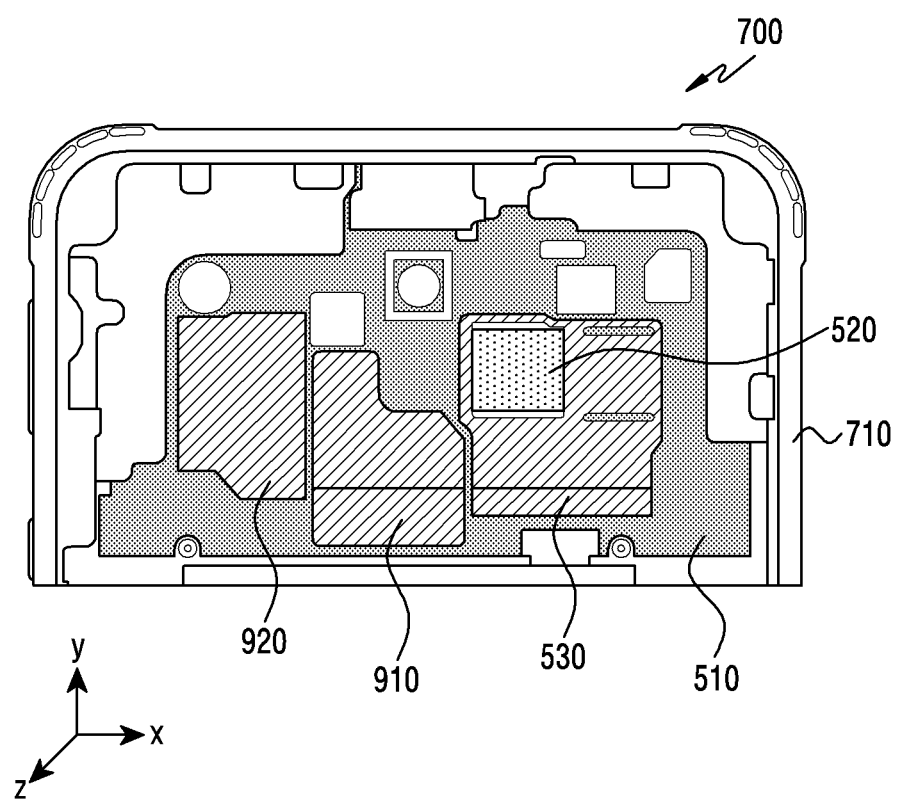
FIG. 9A is a plan view illustrating a shield can relative to electronic components in an electronic device according to an embodiment.

FIG. 9A illustrates a structure in which a shield can is disposed around electronic components in an electronic device according to an embodiment.

Referring to FIG. 9A, the electronic device 700 may include a PCB 510 disposed on the upper end (for example, +y direction) of the electronic device 700. Multiple electronic components may be disposed on the PCB 510, and the area in which electronic components are disposed may be appropriately divided by multiple shield cans. For example, the electronic component 520 may be partially surrounded by a shield can 530 (e.g., a first shield can). In addition, a part or all of at least one component may be shielded by a shield can 910 (e.g., a second shield can) and a shield can 920 (e.g., a third shield can), respectively.

Figure 9B:
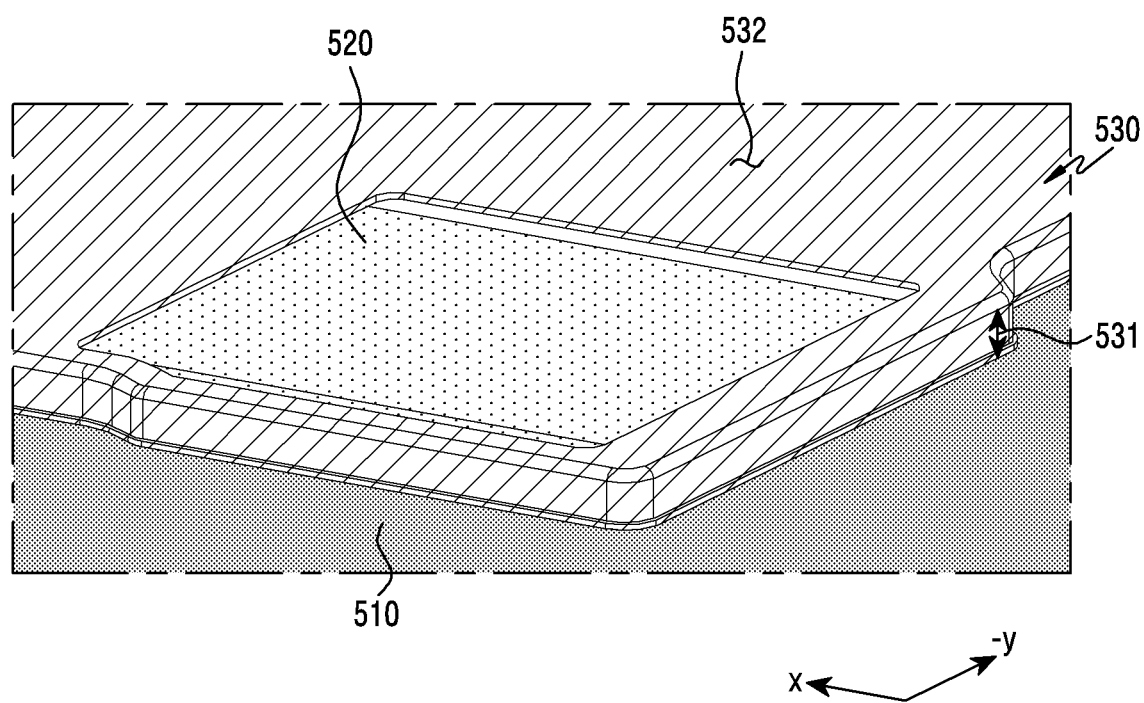
FIG. 9B is a lateral perspective view of the shield can in FIG. 9A.

FIG. 9B is a lateral perspective view of the shield can 530 in FIG. 9A.

Referring to FIG. 9B, the shield can 530 may have a height along the z direction which is appropriate for covering the electronic component 520. The height may be configured larger than the height of the electronic component 520. In an embodiment, the upper surface 532 of the shield can 530 may extend from the side surface of the shield can 530 which is defined by the side wall 531 so as to form at least one opening in the shield can 530 which is open in the z direction. In the example in FIG. 6A or FIG. 6B, the upper surface of the electronic component 520 is illustrated as being positioned inside the opening formed at the upper surface 532 of the shield can 530, but this is for convenience of description, and does not limit embodiments. For example, as illustrated in FIG. 9B, a periphery of the upper surface of the electronic component 520 may be visible through the opening in the shield can 530, but another periphery thereof may not be visible through the opening. In other words, at least one of the transverse/longitudinal sides of the electronic component 520 may have a larger length that the transverse/longitudinal sides of the opening. However, in various embodiments, all transverse/longitudinal sides of the electronic component 520 may have smaller or larger lengths than the transverse/longitudinal sides of the opening.

Figure 10:
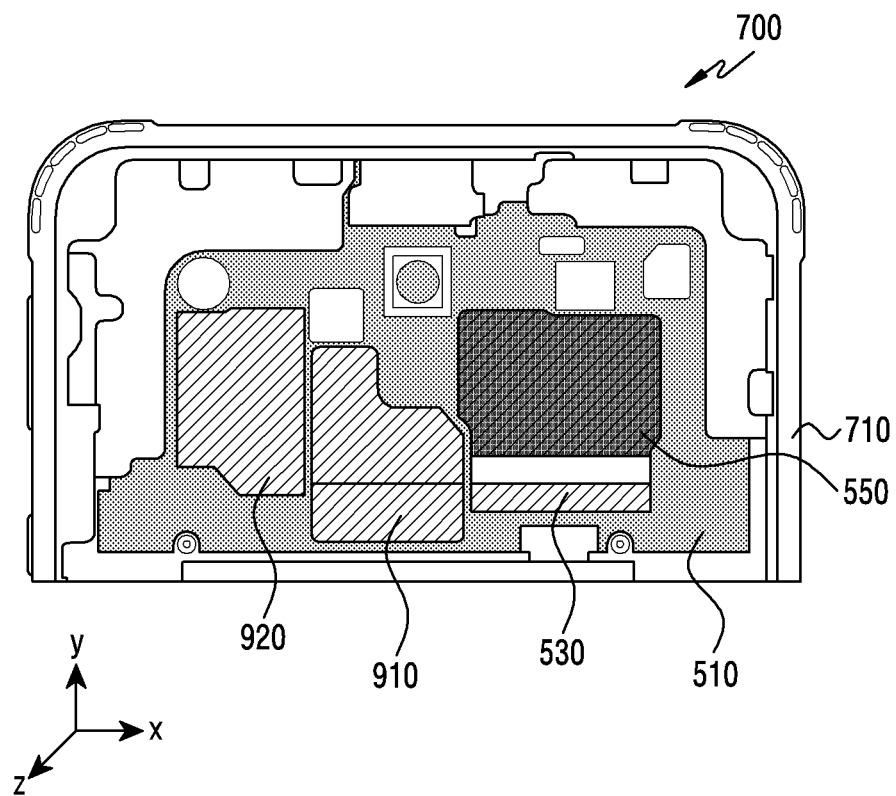
FIG. 10 is a plan view illustrating a structure in which a shielding sheet is disposed on the structure in FIG. 9A and FIG. 9B.

FIG. 10 illustrates a structure in which a shielding sheet 550 is disposed on the structure in FIG. 9A and FIG. 9B.

Referring to FIG. 10, a shielding sheet 550 may be disposed above the shield can 530 disposed around the electronic component 520 of the electronic device 700. In an embodiment, the shielding sheet 550 may cover the entire upper surface of the shield can 530, but may also cover only a part of the upper surface of the shield can 530 as illustrated in FIG. 10. A structure at a first portion (or first area) of the shield can 530 may perform a shielding function on its own, and the shielding sheet 550 may thus be disposed at a remaining area at a second portion (or second area) other than the first portion that can be sufficiently self-shielded by the structure of the shield can 530. The shield can 530 may extend further than an edge of the shielding sheet 550, as shown in FIG. 10, to define an exposed portion of the shield can 530. This exposed portion may include the structure of the shield can 530 which is self-shielding, as compared to the second portion which corresponds to the shielding sheet 550.

Figure 11A:
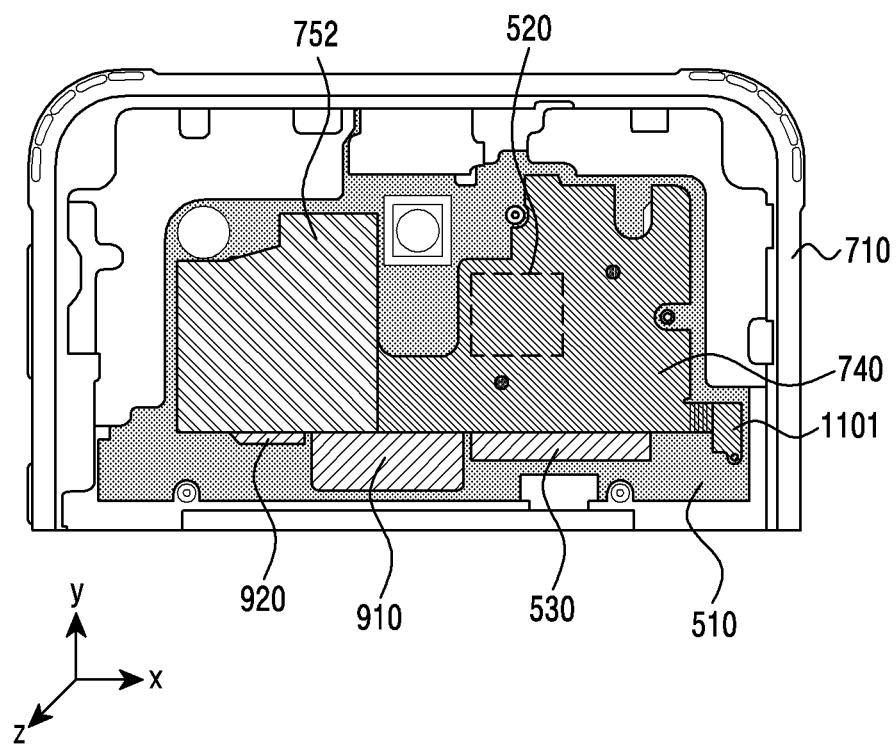
FIG. 11A is a plan view illustrating a structure in which a heat dissipation sheet and an antenna module attached to a rear cover are coupled above a shield can.
Figure 11B:
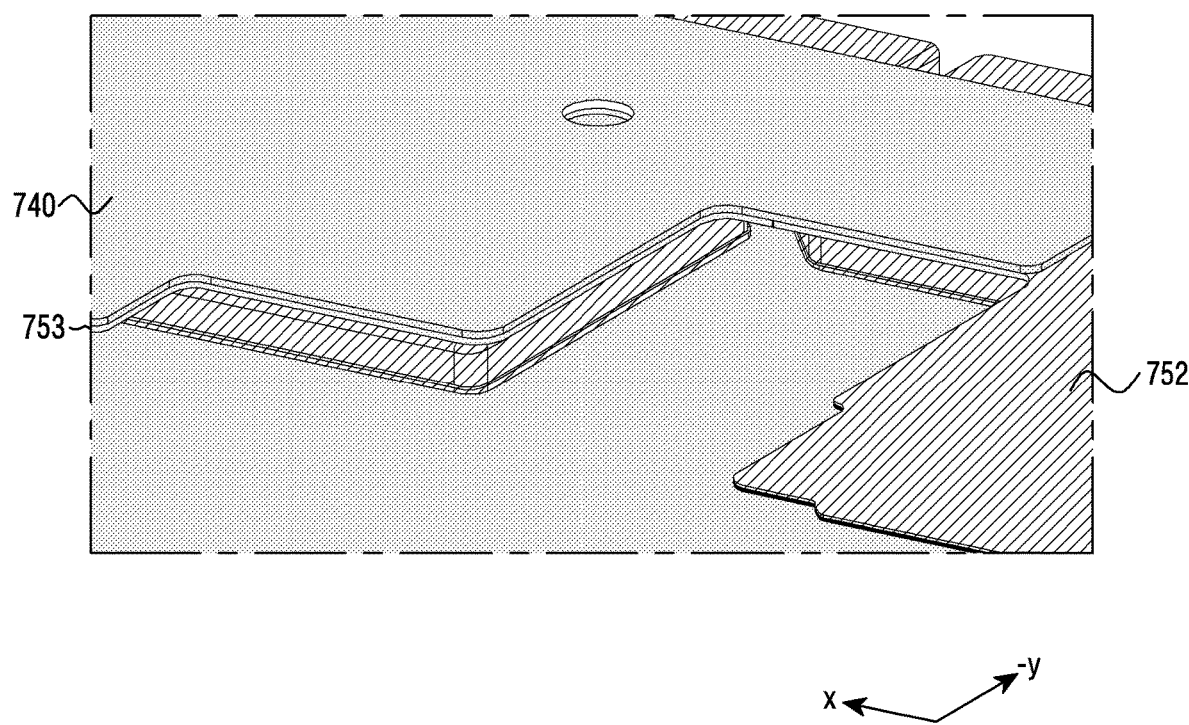
FIG. 11B is a lateral perspective view of the structure in FIG. 11A.

FIG. 11A illustrates a structure in which a heat dissipation sheet and an antenna module attached to a rear cover are coupled above a shield can. FIG. 11B is a lateral perspective view of the structure in FIG. 11A. For reference, the rear cover is not illustrated in FIG. 11A and FIG. 11B, for convenience of description.

Referring to FIG. 11A, the heat diffusion sheet 752 may be disposed to overlap the shield can 530 with reference to a first direction (for example, +z direction). The heat diffusion sheet 752 may cover the entire the shielding sheet 550, but may cover a partial area of the shield can 530. In an embodiment, the heat diffusion sheet 752 may be disposed to cover the entire area of the shielding sheet 550 that covers at least the shield can 530.

In an embodiment, the heat diffusion sheet 752 may be disposed above multiple shield cans as a plurality of shield cans. For example, the heat diffusion sheet 752 may have a size sufficient to cover not only the shield can 530, but also the shield can 910 and the shield can 920, and heat may be widely diffused in the majority of the rear area of the electronic device 700. Referring to FIGS. 11A and 11B, for example, the heat diffusion sheet 752 may overlap a first electrical shield and a second electrical shield (e.g., shield cans among 910, 920 and 53), and define the air gap between the heat diffusion sheet 750, and each of the electrical shields, respectively.

In an embodiment, an antenna module 740 may be disposed above the heat diffusion sheet 752. In an embodiment, the antenna module 740 may be electrically connected to an area of the PCB 510 through a connecting means such as a connector 1101. The antenna module 740 may be supplied with signals and power necessary for operations of the antenna module 740 through the connection with the PCB 510. For example, the antenna module 740 may acquire at least one of information necessary for mobile payment and power necessary for driving of the NFC coil from a processor (for example, application processor (AP)) disposed on the PCB 510 through the connector 1101.

Referring to FIG. 11B, an insulating layer 753 may be disposed below the heat diffusion sheet 752. In an embodiment, the antenna module 740, the heat diffusion sheet 752, and the insulating layer 753 may be formed integrally. In an embodiment, the antenna module 740 may be understood as including the heat diffusion sheet 752 and the insulating layer 753. The antenna module 740 may be attached to the rear cover 720 by an adhesive. The thickness of the antenna module 740 attached to the rear cover 720, the heat diffusion sheet 752, and the insulating layer 753 may be designed such that, when the rear cover 720 is coupled to the housing 710, a predetermined air gap is formed without direct contact with the shielding sheet 550 (refer to FIG. 7, for example).

Figure 12A:
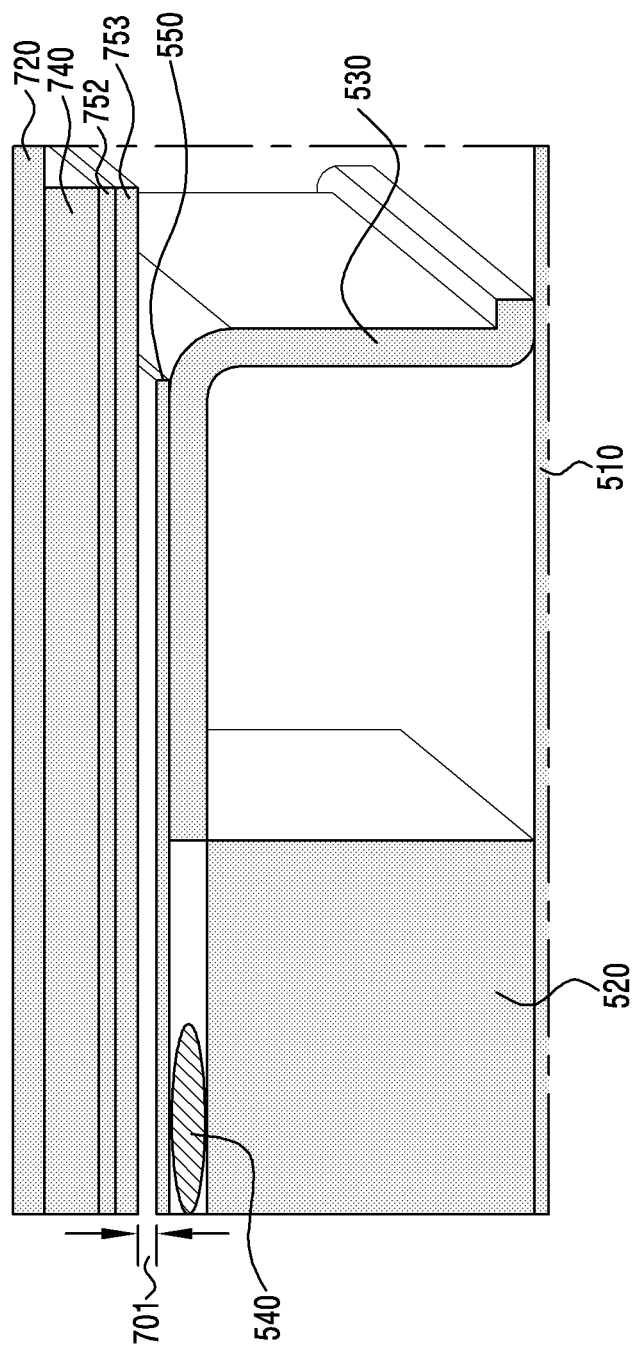
FIG. 12A is a cross-sectional perspective view of an electronic device having shielding and heat dissipation structures and an antenna module according to an embodiment.
Figure 12B:
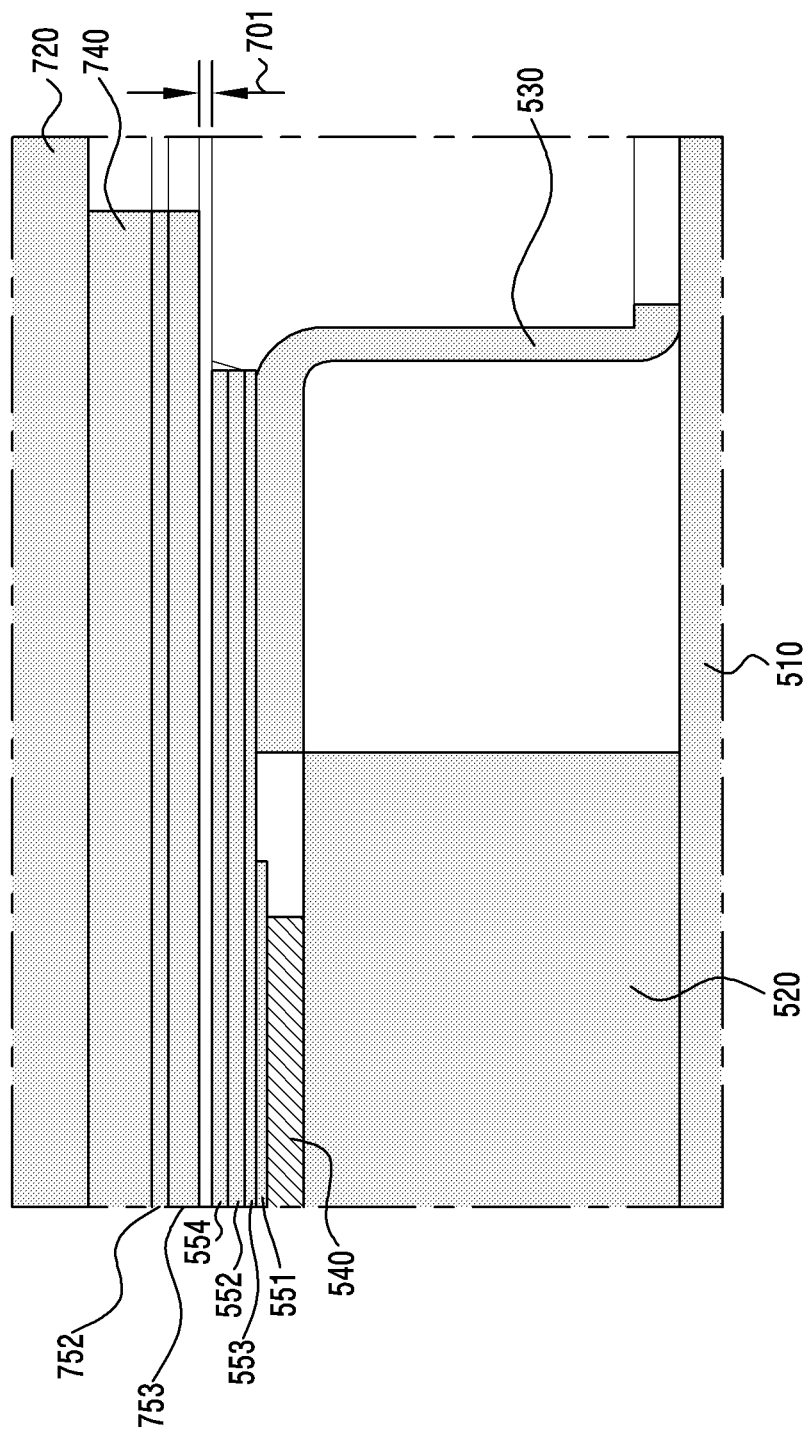
FIG. 12B is a front cross-sectional view of the sectional view in FIG. 12A.

FIG. 12A is a sectional perspective view of an electronic device having shielding and heat dissipation structures and an antenna module according to an embodiment. FIG. 12B is a front view of the sectional view in FIG. 12A.

Referring to FIG. 12A and FIG. 12B, an electronic component 520 may be disposed on the PCB 510. The PCB 510 may have a shield can 530 formed so as to surround the electronic component 520. The shield can 530 may have a side wall that surrounds and faces the side surface of the electronic component 520. The side wall of the shield can 530 may have a height along the z direction which is larger than that of the electronic component 520. The upper end of the side wall of the shield can 530 which is furthest from the PCB 510 may extend to define the upper surface 532 of the shield can 530, and the shield can 530 may be fixed to the PCB 510 at the lower end of the side wall of the shield can 530 which is closest to the PCB 510.

In an embodiment, a thermal interface material 540 may be disposed at the upper end of the electronic component 520, such as to extend along the upper surface thereof. In addition, the upper surface of the electronic component 520, on which the thermal interface material 540 is disposed, and the upper surface of the shield can 530 may be commonly covered by a shielding sheet 550. Through the above-described structure, the electronic component 520 may be encapsulated in a conductive cavity formed by the side wall of the shield can 530, together with the PCB 510 as a ground layer, and the shielding sheet 550, thereby preventing noise generated by the electronic component 520 from escaping out of the conductive cavity or preventing external noise (for example, signals generated by the antenna module 740) from infiltrating the cavity. The shield can 530 together with the shielding sheet 550 may define a shielding enclosure and/or heat dissipating enclosure.

In an embodiment, an insulating layer 753 may be disposed above the shielding sheet 550, at a predetermined interval 701 therebetween. The insulating layer 753 may be formed, at least, on a surface facing the second direction of the heat diffusion sheet 752. The heat diffusion sheet 752 may be attached to the antenna module 740, and the antenna module 740 may be coupled to the rear cover 720.

An electronic device 500 and an electronic device 700 according to an embodiment may include a housing 710, a PCB 510 disposed in the housing, a first electronic component 520 disposed on the PCB, and a shield can 530 configured to surround an area in which the first electronic component is disposed. The shield can may have a side wall 531 and an upper surface 532 which extends from the side wall, and an opening may be formed (or defined) to occupy an area at the upper surface of the shield can, the planar area of the area corresponding to an upper surface of the first electronic component. In addition, the electronic device may include a heat diffusion material 540 applied to the upper surface of the first electronic component, and a shielding sheet 550 disposed to cover the upper surface of the shield can together with the upper surface of the first electronic component, to which the heat diffusion material has been applied.

The shielding sheet 550 may contact the upper surface of the shield can together with contacting the first heat diffusion member 540, as shown in FIG. 12A. In an embodiment, referring to FIG. 12B, the shielding sheet 550 may include a first heat diffusion member 551 which is configured to contact the heat diffusion material 540 and is inside the opening of the shield can, a second heat diffusion member 552 which is configured to contact the upper surface of the shield can, and an adhesive layer 553 disposed between the second heat diffusion member and the upper surface of the shield can, and between the second heat diffusion the first heat diffusion member.

In an embodiment, a first electrical shield 530 is extended around the first electronic component 520, the first electrical shield includes a side wall 531 which extends around the first electronic component, and an upper portion 532 extending from the side wall to define an opening of the first electrical shield which corresponds to the first electronic component. A heat diffusion pattern 540 is on the first electronic component, and a shielding sheet 500 extends across the opening of the first electrical shield and commonly overlaps the first electronic component, the first electrical shield and the heat diffusion pattern. The shielding sheet includes a first heat diffusion member 551 which is inside the opening of the first electrical shield and contacts the heat diffusion pattern 540, and a second heat diffusion member, which is attached to the first heat diffusion member, extends across the opening of the first electrical shield and contacts both the upper portion of the first electrical shield and the first heat diffusion member. That is, the second heat diffusion member includes a heat diffusion sheet 552, together with an adhesive layer 553 between the heat diffusion sheet and the first heat diffusion member 551.

In an embodiment, the opening may have a first size, and the first heat diffusion member may have a second size smaller than the first size. In addition, an area in which the heat diffusion material is applied may have a size smaller than the second size.

In an embodiment, the shielding sheet may further include an insulating layer 554 disposed above the second heat diffusion member. That is, the shielding sheet further includes an insulating layer 554 facing the first heat diffusion member 551 with the second heat diffusion member (e.g., 552 together with 553) therebetween.

In an embodiment, the first heat diffusion member may be spaced apart from a periphery of the opening of the shield can by a designated distance or more. That is, in a direction along the PCB, the first heat diffusion member 551 which is inside the opening of the first electrical shield, is spaced apart from the upper portion of the first electrical shield which defines the opening.

In an embodiment, the housing may form at least a part of an exterior of the electronic device, and the PCB may be disposed in a containing space formed in the housing.

In an embodiment, the first heat diffusion member and the second heat diffusion member may be made of an identical conductive material. That is, the first heat diffusion member 551 and the heat diffusion sheet 552 of the second heat diffusion member (e.g., 552 together with 553) include a same material.

In an embodiment, the electronic device may include a rear cover 720 forming a rear surface of the electronic device, and an antenna module 740 attached inside the rear cover, and an air gap may be formed between the antenna module and the shielding sheet. That is, the electronic device may include the housing which forms an exterior of the electronic device and provides a receiving space within the housing, the shielding sheet may be inside of the receiving space, and an antenna module 740 may be inside the receiving space and facing the shielding sheet with an air gap 701 defined between the antenna module and the shielding sheet.

In an embodiment, the antenna module may include an FPCB including a coil-type antenna radiator for NFC communication and a wireless communication circuit electrically connected to the antenna radiator; and a ferrite disposed below the FPCB.

In an embodiment, a heat diffusion sheet 752 may be attached below the antenna module, and the air gap may be positioned between the heat diffusion sheet and the shielding sheet. The heat diffusion sheet may be made of graphite.

In an embodiment, the electronic device may further include an insulating layer disposed below the heat diffusion sheet.

In an embodiment, the electronic device may further include a second electronic component disposed on the PCB, and an additional shield can be configured to cover the second electronic component and spaced apart from the shield can. The heat diffusion sheet may be disposed to overlap the upper surface of the shield can and the upper surface of the additional shield can with the air gap interposed therebetween.

In an embodiment, the heat diffusion material may be a liquid material applied to a partial area of the upper surface of the first electronic component.

In an embodiment, the electronic device may further include a display 730 forming the front surface of the electronic device. That is, the housing may include a display 730 which displays an image and forms a front surface of the mobile communication device, and a rear cover 720 which is opposite to the display and forms a rear surface of the mobile communication device. The antenna module 740 may be closer to the rear cover 720 than the electrical shield 530.

A mobile communication device according to an embodiment may include a frame structure configured to form a side surface of the mobile communication device, a rear cover coupled to the frame structure so as to form a rear surface of the mobile communication device, an antenna module attached to the rear cover, a printed circuit board (PCB) disposed in a containing space formed by the frame structure, below the antenna module, a first electronic component disposed on the PCB, and a shield can be configured to surround an area in which the first electronic component is disposed. The shield can may have a side wall and an upper surface extending from the side wall, and an opening may be formed in an area on the upper surface of the shield can, the area corresponding to an upper surface of the first electronic component. The mobile communication device may also include a heat diffusion material applied to the upper surface of the first electronic component, and a shielding sheet disposed to cover the upper surface of the shield can and the upper surface of the first electronic component, to which the heat diffusion material has been applied. The shielding sheet may include a first heat diffusion member configured to contact the heat diffusion material and disposed inside the opening of the shield can, a second heat diffusion member configured to contact the upper surface of the shield can and the first heat diffusion member, and an adhesive layer disposed between the second heat diffusion member, the upper surface of the shield can, and the first heat diffusion member. The shielding sheet and the antenna module may be spaced apart by a designated air gap.

The mobile communication device may further include a display configured to form a front surface of the mobile communication device.

In an embodiment, the opening may have a first size, and the first heat diffusion member may have a second size smaller than the first size.

In an embodiment, the mobile communication device may further include at least one processor disposed on the PCB, and the antenna module may be electrically connected to the at least one processor disposed on the PCB through a connector.

In an embodiment, the antenna module may include an FPCB including a coil-type antenna radiator for NFC communication and a wireless communication circuit electrically connected to the antenna radiator, and a ferrite disposed below the FPCB.

An electronic device may include a printed circuit board 510, an electronic component 520 which is on the printed circuit board, an electrical shield 530 which is attached to the printed circuit board and extends around the electronic component, the electrical shield including a side wall 531 which extends around the electronic component, and an upper portion 532 which extends from the side wall to define an opening of the electrical shield which corresponds to the electronic component, a shielding sheet 500 which is connected to the electrical shield, at the upper portion thereof, and forms a shielding cavity together with the printed circuit board and the electrical shield. The shielding sheet 500 (as a combination of layers 552, 553, 551 and 540) extends into the opening (for example, portions 551 and 540) and defines an extended portion (patterns 551 and 540) of the shielding sheet which contacts the electronic component.

In an embodiment, the extended portion of the shielding sheet may include a first heat diffusion layer 540 at which the shielding sheet contacts the electronic component, and a second heat diffusion layer 551 which is coplanar with the upper portion of the electrical shield and spaced apart from the upper portion of the electrical shield in a direction along the printed circuit board. The second heat diffusion layer 551 extends further than an edge of the first heat diffusion layer 540 to define a first portion of the shielding cavity between the second heat diffusion layer 551 and the electronic component. A side surface of the electronic component 520 is spaced apart from the side wall 531 of the electrical shield to define a second portion of the shielding cavity.

The electronic device according to various embodiments disclosed herein may be one of various types of electronic devices. The electronic devices may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that various embodiments of the disclosure and the terms used therein are not intended to limit the technological features set forth herein to particular embodiments and include various changes, equivalents, or alternatives for a corresponding embodiment. With regard to the description of the drawings, similar reference numerals may be used to designate similar or relevant elements.

A singular form of a noun corresponding to an item may include one or more of the items, unless the relevant context clearly indicates otherwise. For example, a reference number labeling a singular form of an element within the figures may be used to reference a plurality of the singular element within the text of the disclosure.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, each of such phrases as "A or B," "at least one of A and B," "at least one of A or B," "A, B, or C," "at least one of A, B, and C," and "at least one of A, B, or C" may include all possible combinations of the items enumerated together in a corresponding one of the phrases. As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

As used herein, such terms as "a first", "a second", "the first", and "the second" may be used to simply distinguish a corresponding element from another, and does not limit the elements in other aspect (e.g., importance or order).

It is to be understood that if an element (e.g., a first element) is referred to, with or without the term "operatively" or "communicatively", as "coupled with/to" or "connected with/to "another element (e.g., a second element), it means that the element may be coupled/connected with/to the other element directly (e.g., wiredly), wirelessly, or via a third element. In contrast, if an element (e.g., a first element) is referred to, as being "directly" related to another element (e.g., a second element), it means that the element may be coupled/connected with/to the other element with no third element or intervening layer therebetween.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "module" may include a unit implemented in hardware, software, or firmware, and may be interchangeably used with other terms, for example, "logic," "logic block," "component," or "circuit". The "module" may be a minimum unit of a single integrated component adapted to perform one or more functions, or a part thereof. For example, according to an embodiment, the "module" may be implemented in the form of an application-specific integrated circuit (ASIC).

Various embodiments as set forth herein may be implemented as software (e.g., a program) including one or more instructions that are stored in a storage medium (e.g., an internal memory 436 or external memory 438) that is readable by a machine (e.g., the electronic device 100). For example, a processor (e.g., the processor) of the machine (e.g., the electronic device 100) may invoke at least one of the one or more stored instructions from the storage medium, and execute it. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Where, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each element (e.g., a module or a program) of the above-described elements may include a single entity or multiple entities. According to various embodiments, one or more of the above-described elements may be omitted, or one or more other elements may be added. Alternatively or additionally, a plurality of elements (e.g., modules or programs) may be integrated into a single element. In such a case, according to various embodiments, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

What is claimed is:

1. An electronic device comprising:
   a printed circuit board;
   a first electronic component which is on the printed circuit board;
   a first electrical shield extended around the first electronic component, the first electrical shield comprising:
      a side wall which extends around the first electronic component, and
      an upper portion extending from the side wall to define an opening of the first electrical shield which corresponds to the first electronic component;
   a heat diffusion pattern on the first electronic component; and
   a shielding sheet which extends across the opening of the first electrical shield and commonly overlaps the first electronic component, the first electrical shield and the heat diffusion pattern,
   wherein the shielding sheet comprises:
      a first heat diffusion member which is inside the opening of the first electrical shield and contacts the heat diffusion pattern; and
      a second heat diffusion member which is attached to the first heat diffusion member, extends across the opening of the first electrical shield and contacts both the upper portion of the first electrical shield and the first heat diffusion member.

2. The electronic device of claim 1, wherein the second heat diffusion member includes a heat diffusion sheet, together with an adhesive layer between the heat diffusion sheet and the first heat diffusion member.

3. The electronic device of claim 1, wherein
   each of the opening and the first heat diffusion member has a planar size, and
   the planar size of the opening is greater than the planar size of the first heat diffusion member.

4. The electronic device of claim 3, wherein the heat diffusion pattern, which is on the first electronic component, has a planar size which is smaller than the planar size of the first heat diffusion member of the shielding sheet.

5. The electronic device of claim 1, wherein the shielding sheet further comprises an insulating layer facing the first heat diffusion member with the second heat diffusion member therebetween.

6. The electronic device of claim 1, wherein in a direction along the printed circuit board, the first heat diffusion member which is inside the opening of the first electrical shield, is spaced apart from the upper portion of the first electrical shield which defines the opening.

7. The electronic device of claim 1, further comprising a housing which forms an exterior of the electronic device and provides a receiving space within the housing,
   wherein the printed circuit board is in the receiving space of the housing.

8. The electronic device of claim 1, wherein
   the second heat diffusion member includes a heat diffusion sheet, together with an adhesive layer between the heat diffusion sheet and the first heat diffusion member, and
   the first heat diffusion member and the heat diffusion sheet of the second heat diffusion member include a same material.

9. The electronic device of claim 1, further comprising:
   a housing which forms an exterior of the electronic device and provides a receiving space within the housing;
   the shielding sheet inside of the receiving space; and
   an antenna module which is inside the receiving space and facing the shielding sheet with an air gap defined between the antenna module and the shielding sheet.

10. The electronic device of claim 9, wherein the antenna module comprises:
    a flexible printed circuit board comprising an antenna radiator which provides near field communication, and a wireless communication circuit electrically connected to the antenna radiator; and
    a ferrite below the flexible printed circuit board.

11. The electronic device of claim 9, further comprising a heat diffusion sheet which is attached to the antenna module and is between the shielding sheet and the antenna module,
    wherein the air gap is between the heat diffusion sheet and the shielding sheet.

12. The electronic device of claim 11, wherein the heat diffusion sheet includes graphite.

13. The electronic device of claim 11, further comprising:
a second electronic component on the printed circuit board and spaced apart from the first electronic component in a direction along the printed circuit board; and
a second electrical shield which is extended around the second electronic component and spaced apart from the first electrical shield,
wherein the heat diffusion sheet overlaps the first electrical shield and the second electrical shield, and defines the air gap between the heat diffusion sheet and the first electrical shield and between the heat diffusion sheet and the second electrical shield.

14. A mobile communication device comprising:
a housing which forms an exterior of the electronic device and provides a receiving space within the housing;
an antenna module in the receiving space of the housing;
a printed circuit board which is in the receiving space of the housing and facing the antenna module;
an electronic component on the printed circuit board;
an electrical shield extended around the electronic component, the electrical shield comprising:
a side wall which extends around the electronic component, and
an upper portion extending from the side wall to define an opening of the electrical shield which corresponds to the electronic component;
a heat diffusion pattern on the electronic component; and
a shielding sheet which extends across the opening of the electrical shield and commonly overlaps the electronic component, the electrical shield and the heat diffusion pattern,
wherein the shielding sheet comprises:
a first heat diffusion member which is inside the opening of the electrical shield and contacts the heat diffusion pattern; and
a second heat diffusion member which is attached to the first heat diffusion member, extends across the opening of the electrical shield and contacts both the upper portion of the electrical shield and the first heat diffusion member, and
within the receiving space, the shielding sheet and the antenna module define an air gap therebetween.

15. The mobile communication device of claim 14, wherein
the housing comprises:
a display which displays an image and forms a front surface of the mobile communication device, and
a rear cover which is opposite to the display and forms a rear surface of the mobile communication device, and
the antenna module is closer to the rear cover than the electrical shield.

16. The mobile communication device of claim 14, wherein
each of the opening and the first heat diffusion member has a planar size, and
the planar size of the opening is greater than the planar size of the first heat diffusion member.

17. An electronic device comprising:
a printed circuit board;
an electronic component which is on the printed circuit board;
an electrical shield which is attached to the printed circuit board and extends around the electronic component, the electrical shield comprising a side wall which extends around the electronic component, and an upper portion which extends from the side wall to define an opening of the electrical shield which corresponds to the electronic component;
a shielding sheet which is connected to the electrical shield, at the upper portion thereof, and forms a shielding cavity together with the printed circuit board and the electrical shield,
wherein the shielding sheet extends into the opening and defines an extended portion of the shielding sheet which contacts the electronic component.

18. The electronic device of claim 17, wherein the extended portion of the shielding sheet comprises:
a first heat diffusion layer at which the shielding sheet contacts the electronic component; and
a second heat diffusion layer which is coplanar with the upper portion of the electrical shield and spaced apart from the upper portion of the electrical shield in a direction along the printed circuit board.

19. The electronic device of claim 18, wherein
the second heat diffusion layer extends further than an edge of the first heat diffusion layer to define a first portion of the shielding cavity between the second heat diffusion layer and the electronic component; and
a side surface of the electronic component is spaced apart from the side wall of the electrical shield to define a second portion of the shielding cavity.

20. The electronic device of claim 18, further comprising:
a housing which forms an exterior of the electronic device and provides a receiving space within the housing;
the shielding sheet inside of the receiving space; and
an antenna module which is inside the receiving space and facing the shielding sheet with an air gap defined between the antenna module and the shielding sheet.

* * * * *